(12) United States Patent
Yonge, III

(10) Patent No.: US 6,289,000 B1
(45) Date of Patent: Sep. 11, 2001

(54) FRAME CONTROL ENCODER/DECODER FOR ROBUST OFDM FRAME TRANSMISSIONS

(75) Inventor: Lawrence W. Yonge, III, Ocala, FL (US)

(73) Assignee: Intellon Corporation, Ocala, FL (US)

( * ) Notice: Subject to any disclaimer, the term of this patent is extended or adjusted under 35 U.S.C. 154(b) by 0 days.

(21) Appl. No.: 09/574,959

(22) Filed: May 19, 2000

(51) Int. Cl.[7] .............................. H04J 11/00; H04B 1/00
(52) U.S. Cl. ............................. 370/203; 375/346
(58) Field of Search .................................. 370/203–208, 370/209, 210; 375/135, 136, 150, 261, 262, 265, 146–147, 295, 316, 346–347

(56) References Cited

U.S. PATENT DOCUMENTS

| | | | |
|---|---|---|---|
| 4,881,241 | 11/1989 | Pommier et al. | 375/38 |
| 5,197,061 | 3/1993 | Halbert-Lassalle et al. | 370/11 |

(List continued on next page.)

OTHER PUBLICATIONS

Goalic et al., "Real–Time Turbo–Decoding of Product Codes on a Digital Signal Processor," IEEE, pp. 624–628 (1997).
Benedetto et al., "A Soft–Input Soft–Output Maximum A Posteriori (MAP) Module to Decode Parallel and Serial Concatenated Codes," TDA Progress Report 42–127, pp. 1–20 (11/96).
Peterson et al., "Error–Correcting Codes," The MIT Press (1972).
Pyndiah, "Near–Optimum Decoding of Product Codes: Block Turbo Codes," IEEE Transactions on Communications, vol. 46, No. 8, pp. 1003–1010 (08/98).
Pyndiah, "Near Optimum Decoding of Product Codes," IEEE, pp. 339–343 (1994).
Pyndiah, "Performance of Block Turbo Coded 16–QAM and 64–QAM Modulations," IEEE, pp. 1039–1043 (1995).

*Primary Examiner*—Wellington Chin
*Assistant Examiner*—Maikhanh Tran
(74) *Attorney, Agent, or Firm*—Fish & Richardson P.C.

(57) ABSTRACT

An encoder/decoder scheme for robust transmission of PHY layer frame control information (to support medium access) in OFDM frames (or packets). The PHY layer frame control information to be modulated onto carriers in OFDM symbols is encoded using a product coding to form a product code block or matrix. The product coding is based on a shortened hamming code codeword set having properties of symmetry. Elements of the product code matrix are interleaved so that the elements are modulated onto the carriers of the symbols in diagonal groupings (across time and frequency) and with some degree of redundancy. The modulated elements are demodulated to produce soft decision values, which are de-interleaved to combine copies of the soft values for elements and re-order the soft values in the order of the elements prior to interleaving. The soft values for each row and each column are provided to a turbo product decoder, which performs a number of iterations of row/column decoding, each iteration applying a weighting to the results to enhance the reliability of the results of each next successive iteration. Upon completion of the final iteration, the decoder applies a hard decision to the soft values to produce a set of hard values for each of the soft values that corresponds to the frame control information. Given the symmetry of the code set, the row/column decoding generates a complete set of correlation values from only a subset of the complete set of correlation values and uses a reduced number of MAP decoding operations to select the best correlation values for each of the soft values.

38 Claims, 20 Drawing Sheets

U.S. PATENT DOCUMENTS

| | | | |
|---|---|---|---|
| 5,228,025 | 7/1993 | Le Floch et al. | 370/20 |
| 5,274,629 | 12/1993 | Helard et al. | 370/50 |
| 5,307,376 | 4/1994 | Castelain et al. | 375/38 |
| 5,416,801 | 5/1995 | Chouly et al. | 375/260 |
| 5,452,288 | 9/1995 | Rahuel et al. | 370/19 |
| 5,452,322 | 9/1995 | Lauer | 375/330 |
| 5,483,529 | 1/1996 | Baggen et al. | 370/70 |
| 5,488,632 | 1/1996 | Mason et al. | 375/260 |
| 5,524,027 | 6/1996 | Huisken | 375/341 |
| 5,555,268 * | 9/1996 | Fattouche et al. | 370/209 |
| 5,563,897 | 10/1996 | Pyndiah et al. | 371/37.4 |
| 5,610,908 | 3/1997 | Shelswell et al. | 370/210 |
| 5,694,389 | 12/1997 | Seki et al. | 370/208 |
| 5,757,766 | 5/1998 | Sugita | 370/206 |
| 5,799,033 | 8/1998 | Baggen | 375/200 |
| 5,812,599 | 9/1998 | Van Kerchkhove | 375/260 |
| 5,825,807 | 10/1998 | Kumar | 375/200 |
| 5,903,614 | 5/1999 | Suzuki et al. | 375/340 |
| 5,914,932 | 6/1999 | Suzuki et al. | 370/203 |
| 5,966,412 | 10/1999 | Ramaswamy | 375/341 |
| 6,005,894 * | 12/1999 | Kumar | 375/270 |
| 6,125,150 | 9/2000 | Wesel et al. | 375/265 |
| 6,151,296 | 11/2000 | Vijayan et al. | 370/208 |

* cited by examiner

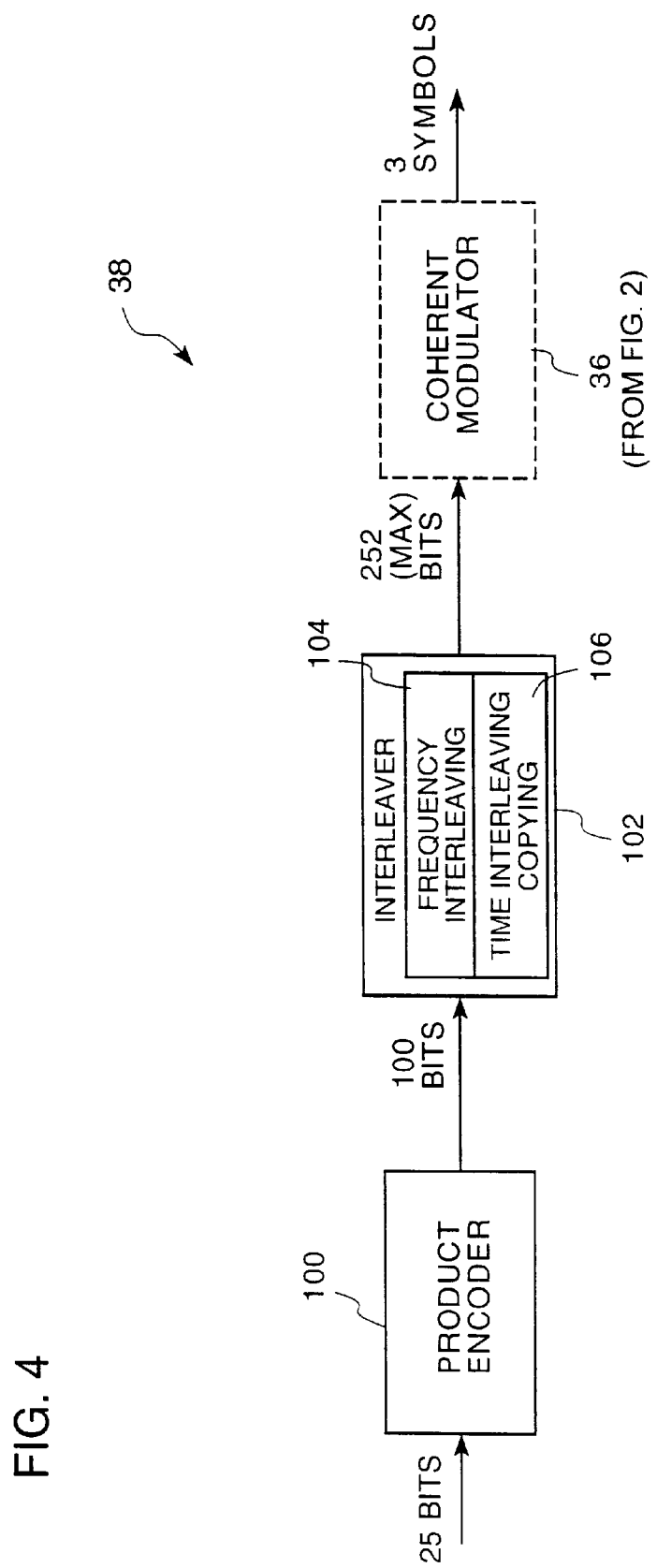

FIG. 11A

| Carrier | Symbol 1 | Symbol 2 | Symbol 3 | Carrier | Symbol 1 | Symbol 2 | Symbol 3 |
|---|---|---|---|---|---|---|---|
| 0 | 0 | 11 | 22 | 42 | 64 | 75 | 86 |
| 1 | 33 | 44 | 55 | 43 | 97 | 7 | 18 |
| 2 | 66 | 77 | 88 | 44 | 29 | 30 | 41 |
| 3 | 99 | 9 | 10 | 45 | 52 | 63 | 74 |
| 4 | 21 | 32 | 43 | 46 | 85 | 96 | 6 |
| 5 | 54 | 65 | 76 | 47 | 17 | 28 | 39 |
| 6 | 87 | 98 | 8 | 48 | 40 | 51 | 62 |
| 7 | 19 | 20 | 31 | 49 | 73 | 84 | 95 |
| 8 | 42 | 53 | 64 | 50 | 5 | 16 | 27 |
| 9 | 75 | 86 | 97 | 51 | 38 | 49 | 50 |
| 10 | 7 | 18 | 29 | 52 | 61 | 72 | 83 |
| 11 | 30 | 41 | 52 | 53 | 94 | 4 | 15 |
| 12 | 63 | 74 | 85 | 54 | 26 | 37 | 48 |
| 13 | 96 | 6 | 17 | 55 | 59 | 60 | 71 |
| 14 | 28 | 39 | 40 | 56 | 82 | 93 | 3 |
| 15 | 51 | 62 | 73 | 57 | 14 | 25 | 36 |
| 16 | 84 | 95 | 5 | 58 | 47 | 58 | 69 |
| 17 | 16 | 27 | 38 | 59 | 70 | 81 | 92 |
| 18 | 49 | 50 | 61 | 60 | 2 | 13 | 24 |
| 19 | 72 | 83 | 94 | 61 | 35 | 46 | 57 |
| 20 | 4 | 15 | 26 | 62 | 68 | 79 | 80 |
| 21 | 37 | 48 | 59 | 63 | 91 | 1 | 12 |
| 22 | 60 | 71 | 82 | 64 | 23 | 34 | 45 |
| 23 | 93 | 3 | 14 | 65 | 56 | 67 | 78 |
| 24 | 25 | 36 | 47 | 66 | 89 | 90 | 0 |
| 25 | 58 | 69 | 70 | 67 | 11 | 22 | 33 |
| 26 | 81 | 92 | 2 | 68 | 44 | 55 | 66 |
| 27 | 13 | 24 | 35 | 69 | 77 | 88 | 99 |
| 28 | 46 | 57 | 68 | 70 | 9 | 10 | 21 |
| 29 | 79 | 80 | 91 | 71 | 32 | 43 | 54 |
| 30 | 1 | 12 | 23 | 72 | 65 | 76 | 87 |
| 31 | 34 | 45 | 56 | 73 | 98 | 8 | 19 |
| 32 | 67 | 78 | 89 | 74 | 20 | 31 | 42 |
| 33 | 90 | 0 | 11 | 75 | 53 | 64 | 75 |
| 34 | 22 | 33 | 44 | 76 | 86 | 97 | 7 |
| 35 | 55 | 66 | 77 | 77 | 18 | 29 | 30 |
| 36 | 88 | 99 | 9 | 78 | 41 | 52 | 63 |
| 37 | 10 | 21 | 32 | 79 | 74 | 85 | 96 |
| 38 | 43 | 54 | 65 | 80 | 6 | 17 | 28 |
| 39 | 76 | 87 | 98 | 81 | 39 | 40 | 51 |
| 40 | 8 | 19 | 20 | 82 | 62 | 73 | 84 |
| 41 | 31 | 42 | 53 | 83 | 95 | 5 | 16 |

Fig. 11B

| Carrier | Symbol 1 | Symbol 2 | Symbol 3 | Symbol 4 | Carrier | Symbol 1 | Symbol 2 | Symbol 3 | Symbol 4 |
|---|---|---|---|---|---|---|---|---|---|
| 0 | 0 | 22 | 33 | 44 | 42 | 95 | 7 | 18 | 73 |
| 1 | 11 | 66 | 88 | 99 | 43 | 30 | 41 | 52 | 29 |
| 2 | 55 | 77 | 23 | 45 | 44 | 85 | 96 | 63 | 74 |
| 3 | 1 | 12 | 34 | 89 | 45 | 31 | 42 | 8 | 19 |
| 4 | 56 | 67 | 78 | 90 | 46 | 75 | 97 | 53 | 20 |
| 5 | 2 | 13 | 24 | 35 | 47 | 86 | 32 | 9 | 64 |
| 6 | 46 | 57 | 79 | 80 | 48 | 21 | 43 | 54 | 10 |
| 7 | 91 | 68 | 14 | 36 | 49 | 76 | 87 | 98 | 85 |
| 8 | 47 | 3 | 25 | 70 | 50 | 33 | 44 | 0 | 22 |
| 9 | 92 | 58 | 69 | 81 | 51 | 88 | 99 | 11 | 66 |
| 10 | 37 | 4 | 15 | 28 | 52 | 23 | 45 | 55 | 77 |
| 11 | 48 | 59 | 60 | 71 | 53 | 34 | 89 | 1 | 12 |
| 12 | 82 | 93 | 5 | 27 | 54 | 78 | 90 | 56 | 67 |
| 13 | 38 | 49 | 16 | 61 | 55 | 24 | 35 | 2 | 13 |
| 14 | 83 | 94 | 50 | 72 | 56 | 79 | 80 | 46 | 57 |
| 15 | 28 | 40 | 6 | 17 | 57 | 14 | 36 | 91 | 68 |
| 16 | 39 | 84 | 51 | 62 | 58 | 25 | 70 | 47 | 3 |
| 17 | 73 | 95 | 7 | 18 | 59 | 69 | 81 | 92 | 58 |
| 18 | 29 | 30 | 41 | 52 | 60 | 15 | 26 | 37 | 4 |
| 19 | 74 | 85 | 96 | 83 | 61 | 60 | 71 | 48 | 59 |
| 20 | 19 | 31 | 42 | 8 | 62 | 5 | 27 | 82 | 93 |
| 21 | 20 | 75 | 97 | 53 | 63 | 16 | 61 | 38 | 49 |
| 22 | 64 | 86 | 32 | 9 | 64 | 50 | 72 | 83 | 94 |
| 23 | 10 | 21 | 43 | 54 | 65 | 6 | 17 | 28 | 40 |
| 24 | 65 | 76 | 87 | 98 | 66 | 51 | 62 | 39 | 84 |
| 25 | 22 | 33 | 44 | 0 | 67 | 7 | 18 | 73 | 95 |
| 26 | 66 | 88 | 99 | 11 | 68 | 41 | 52 | 29 | 30 |
| 27 | 77 | 23 | 45 | 55 | 69 | 96 | 63 | 74 | 85 |
| 28 | 12 | 34 | 89 | 1 | 70 | 42 | 8 | 19 | 31 |
| 29 | 67 | 78 | 90 | 56 | 71 | 97 | 53 | 20 | 75 |
| 30 | 13 | 24 | 35 | 2 | 72 | 32 | 9 | 64 | 86 |
| 31 | 57 | 79 | 80 | 46 | 73 | 43 | 54 | 10 | 21 |
| 32 | 68 | 14 | 36 | 91 | 74 | 87 | 98 | 55 | 76 |
| 33 | 3 | 25 | 70 | 47 | 75 | 44 | 0 | 22 | 33 |
| 34 | 58 | 69 | 81 | 92 | 76 | 99 | 11 | 86 | 88 |
| 35 | 4 | 15 | 26 | 37 | 77 | 45 | 55 | 77 | 23 |
| 36 | 59 | 60 | 71 | 46 | 78 | 89 | 1 | 12 | 34 |
| 37 | 93 | 5 | 27 | 82 | 79 | 90 | 56 | 87 | 78 |
| 38 | 49 | 16 | 81 | 38 | 80 | 35 | 2 | 13 | 24 |
| 39 | 94 | 50 | 72 | 83 | 81 | 80 | 46 | 57 | 79 |
| 40 | 40 | 8 | 17 | 28 | 82 | 36 | 91 | 68 | 14 |
| 41 | 84 | 51 | 62 | 39 | 83 | 70 | 47 | 3 | 25 |

FRAME CONTROL ENCODER/DECODER FOR ROBUST OFDM FRAME TRANSMISSIONS

BACKGROUND OF THE INVENTION

The invention relates to OFDM (Orthogonal Frequency Division Multiplexing) data transmission systems.

In OFDM data transmission systems, available transmission channel bandwidth is subdivided into a number of discrete channels or carriers that are overlapping and orthogonal to each other. Data are transmitted in the form of symbols that have a predetermined duration and encompass some number of carrier frequencies. The data transmitted over these OFDM symbol carriers may be encoded and modulated in amplitude and/or phase, using conventional schemes such as Binary Phase Shift Key (BPSK) or Quadrature Phase Shift Key (QPSK).

A well-known problem in the art of OFDM data transmission systems is that of impulse noise, which can produce bursts of error on transmission channels, and delay spread, which often causes frequency selective fading. To address these problems, prior systems have utilized forward error correction (FEC) coding in conjunction with interleaving techniques. FEC coding adds parity data that enables one or more errors in a code word to be detected and corrected. Interleaving reorders the code word bits in a block of code word data prior to transmission to achieve time and frequency diversity.

Although the prior interleaving techniques can minimize some of the effects of impulse noise and delay spread on OFDM data transmission, they cannot mitigate the collective impact of impulse noise and frequency nulls, which may result in lengthy noise events. Additionally, the same FEC encoding and interleaving are used for all data to be transmitted, thus providing the same level of error protection irrespectively of the importance of the data and how the data are to be used.

SUMMARY OF THE INVENTION

The present invention features a mechanism for encoding and decoding of frame data for robust OFDM transmissions of the frame data, in particular, frame control information.

In one aspect of the invention, encoding frame data for an OFDM frame transmission includes producing a code block of elements from frame data to be modulated onto carriers of OFDM symbols in an OFDM frame, and interleaving the elements so that the elements are modulated onto the carriers in groupings along diagonals were the elements to be organized as a matrix.

Embodiments of the invention may include one or more of the following features.

The frame data can include PHY layer frame control information for supporting a medium access control protocol. The OFDM frame can include at least one delimiter and the PHY layer frame control information can be located in the at least one delimiter. The OFDM frame can include a body and the at least one delimiter can include a start delimiter that precedes the body. The at least one delimiter can further include an end delimiter than follows the body. The at least one delimiter can be a response or a Request-to-Send (RTS) type of delimiter. The medium access control protocol can be a Carrier Sense Multiple Access type. The medium access control protocol can be a Time Division Multiple Access protocol and the at least one delimiter can include beacon information used by such protocol. The medium access control protocol can be token passing type.

Interleaving can include selecting from the elements along the diagonals to produce diagonal sequences. Collectively, the diagonal sequences can form a vector of vector elements. Interleaving can further include selecting consecutive vector elements from the vector for modulation on carriers in a succession of symbols so that the elements in the diagonals appear on adjacent carriers and across adjacent symbols in the succession of symbols to produce the groupings along diagonals. Selecting the vector elements from the vector for modulation on carriers in the successive symbols can result in a level of redundancy.

For a number of OFDM symbols equal to three, selecting can include selecting a first element in a main diagonal and then selecting every third element from among consecutive elements in the diagonals and placing the selected first element and every third element in the vector in the order of selection. Interleaving can further include selecting consecutive vector elements from the vector for modulation on carriers in a succession of symbols so that the consecutive elements in the diagonals appear on adjacent carriers across adjacent symbols in the succession of symbols. Selecting consecutive vector elements from the vector for modulation on carriers in the successive symbols can result in a level of redundancy.

For a number of OFDM symbols equal to four and the vector arranged as an array of four columns of rows, selecting includes selecting consecutive elements along each of the diagonals and placing the selected elements in the vector in groups of adjacent rows.

The code block can be a product code block and producing can include deriving the product code block from a shortened extended hamming code code word set. Producing can further include selecting a generator matrix to achieve symmetric properties of the code word set.

The OFDM frame can include a body and the frame data can include frame control information that precedes the body. Alternatively, the OFDM frame can be an acknowledgement frame and the frame data can include frame control information.

In another aspect of the invention, decoding encoded frame control information includes producing soft decision values from frame control information encoded in code words having information bits, and modulated in an interleaved order onto carriers in OFDM symbols, the code words belonging to a set of code words having properties of symmetry, de-interleaving the soft decision values to produce sets of soft decision values, each set associated with one of the code words, and performing on each set of soft decision values a decoding procedure according to the properties of symmetry to reduce the complexity of the decoding procedure.

Embodiments of the invention may include one or more of the following features.

The decoding procedure can be a turbo decoding procedure and performing the turbo decoding procedure can include performing each of i iterations. Performing each of i iterations can include the following: determining a new set of soft decision values from the set of decision values; determining difference values for a difference between the set of soft decision values and the new set of soft decision values; weighting the difference values; and updating the set of soft decision values with the sum of the set of soft decision values and the weighted difference values.

Determining a new set of soft decision values can include generating from the set of soft decision values correlation values corresponding to a subset of the code word set and generating from correlation values corresponding to the subset correlation values corresponding to a remainder of the code word set based on the properties of symmetry of the code word set.

Determining a new set of soft decision values can further include using the properties of symmetry of the code word set to select a best correlation value for each of the soft decision values.

Performing can further include producing a hard decision value from each set of soft decision values for each of the information bits in the one of the code words with which the set of soft decision values is associated.

The code words can be produced by a product code and the turbo decoding procedure can be a turbo product decoding procedure.

The code words can be in the form of a product code block of elements, the interleaved order can include copies of at least some of the elements and decoding the encoded frame control information can further include combining the copies. Combining can include producing phase noise values for the copies, weighting the copies according to the phase noise values and summing the weighted copies.

Among the advantages of the present invention are the following. The interleaving technique provides a level of redundancy and combines that level of redundancy with diversity in the frequency and time domains in a way that tolerates higher bit error rates. Consequently, because the code word bits are grouped along diagonals and these diagonal groupings are distributed across consecutive carriers within a single symbol as well as across consecutive symbols for a single carrier, the level of protection against burst transmission errors is greatly improved. For example, it is possible to lose bits on a group of adjacent carriers due to a frequency null and still recover the code words to which those bits belong. Additionally, because of the redundancy as well as the diagonal arrangement of the bits resulting from the interleaving, it possible to receive an entire symbol of corrupted bits and correct the code words that include those corrupted bits.

Moreover, the selection of the generator matrix to produce a set of code words (against which the code words are correlated during decoding) for properties of symmetry allows the frame control decoder implementation to be much simplified. That is, the frame control decoding mechanism is able to exploit symmetries of the code set to decode in fewer operations and with reduced circuitry.

Other features and advantages of the invention will be apparent from the following detailed description and from the claims.

BRIEF DESCRIPTION OF THE DRAWINGS

FIG. 4 is a block diagram of the frame control encoder (of FIG. 2) including a product encoder and an interleaver employing frequency interleaving and time interleaving/copying processes.

FIG. 11A is an illustration of carrier assignment within each of three OFDM frame control symbols after the frame control information are interleaved according to the interleaving and copying processes of FIGS. 9A–B and FIG. 10.

FIG. 11B is an exemplary illustration of carrier assignment within each of four OFDM frame control symbols.

DETAILED DESCRIPTION

Figure 1:
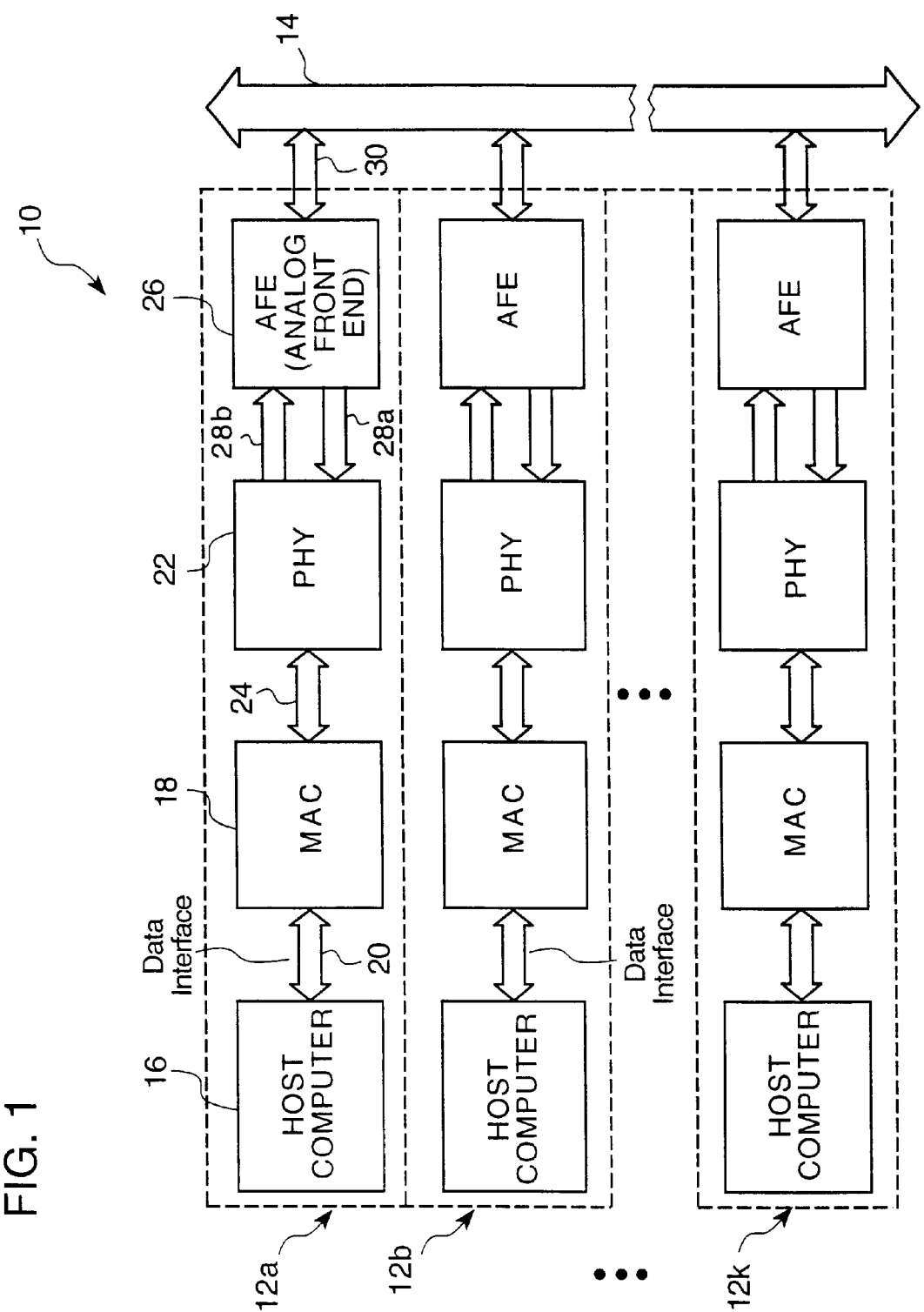
FIG. 1 is a data network of network nodes coupled to a transmission channel, each of the nodes in the data network including an end device (shown as a host computer), a media access control unit, a physical layer device and a analog front end unit.

Referring to FIG. 1, a network 10 includes network nodes 12a, 12b, . . . 12k coupled to a transmission medium or channel 14, e.g., a power line. During a communication between at least two of the network nodes 12 over the transmission medium 14, a first network node (for example, 12a) serves as a transmitting network node and at least one second network node (for example, 12b) serves as a receiving network node. Each network node 12 includes an end device 16, e.g., a host computer (as shown), cable modem, etc. The network node 12 further includes a media access control (MAC) unit 18 connected to the end device 16 by a data interface 20, a physical layer (PHY) unit 22 connected to the MAC unit 18 by a MAC-to-PHY I/O bus 24 and an analog front-end (AFE) unit 26. The AFE unit 26 connects to the PHY unit 22 by separate AFE input lines 28a and output lines 28b, as well as connects to the transmission medium 14 by an AFE-to-PL interface 30.

Generally, the MAC and PHY units conform to the Open System Interconnect (OSI) Model's data link layer and the physical layer, respectively. The MAC unit 18 performs data encapsulation/decapsulation, as well as media access management for transmit (Tx) and receive (Rx) functions. Preferably, the MAC unit 18 employs a collision avoidance medium access control scheme like Carrier Sense Multiple Access with Collision Avoidance (CSMA/CA) as described by the IEEE 802.11 standard, although other suitable MAC protocols of the collision avoidance type and other types may be used. For example, Time Division Multiple Access (TDMA) or token passing schemes may be used. The PHY unit 22 performs transmit encoding and receive decoding, among other functions, as described more fully below. The AFE unit 26 provides for attachment to the transmission medium 14. The MAC and AFE units may be implemented in any manner and therefore will be discussed no further herein.

The unit of communication exchanged between nodes is in the form of a frame (or packet). The terms "frame" and "packet" as used interchangeably herein refer to a PHY layer protocol data unit (PDU). A frame includes such frame data as delimiter information and data (i.e., payload), as will be discussed. A delimiter is a combination of preamble and frame control information. The data and frame control information are received from the MAC layer, but are handled differently by the PHY layer, as will be described below with reference to FIG. 2. Frame and delimiter structures will be described in further detail with reference to FIG. 3.

Figure 2:
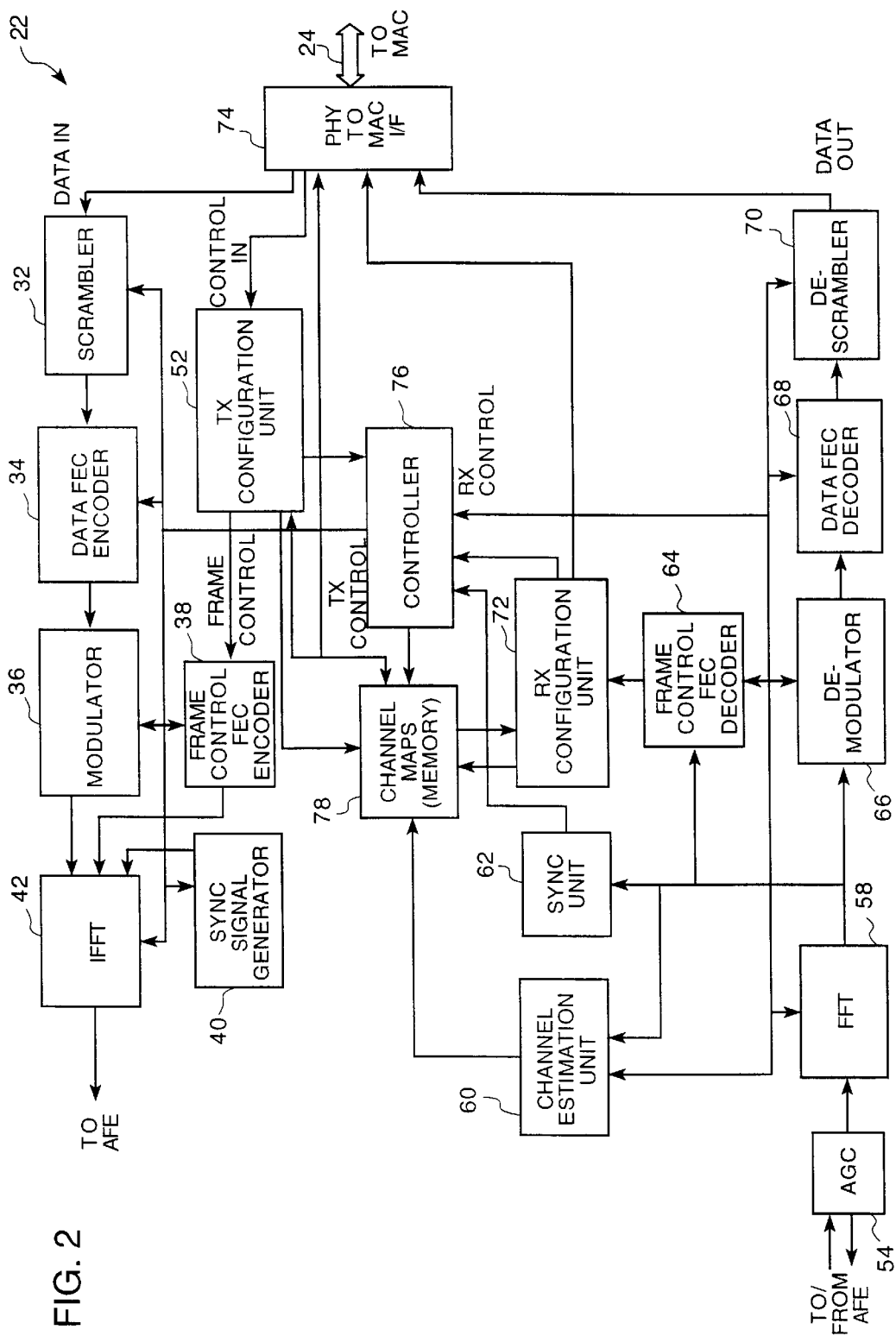
FIG. 2 is a detailed block diagram of the physical layer (PHY) unit (shown in FIG. 1) that includes, among other functional units, a frame control encoder and a frame control decoder.

Referring to FIG. 2, the PHY unit 22 performs both Tx and Rx functions for a single node. To support Tx functions, the PHY unit 22 includes a scrambler 32, a data FEC encoder 34 (for encoding data received from the MAC unit 18), a modulator 36, a frame control FEC encoder 38 for encoding frame control information, a synchronization signal generator 40 and an IFFT unit 42. Conventional post-IFFT devices are omitted for purpose of simplification. The post-IFFT devices may include, for example, a preamble block (for defining a preamble signal used for automatic gain control and synchronization), a cyclic prefix block with raised cosine windowing and a peak limiter, as well as output buffering. Also included is a transmit (Tx) configuration unit 52. To support Rx functions, the PHY unit 22 includes an automatic gain control (AGC) unit 54, an FFT unit 58, a channel estimation unit 60, a synchronization unit 62, a frame control FEC decoder 64, a demodulator 66, a data FEC decoder 68, a descrambler 70, and a receive (Rx) configuration unit 72. Included in the PHY unit 22 and shared by both the transmit and receive functions are a MAC interface 74, a PHY controller 76 and a channel maps memory 78.

During a data transmit process, data and control information are received at the PHY-to-MAC interface (MAC interface) 74 over the PHY-to-MAC bus 24. The MAC interface provides the data to the scrambler 32, which ensures that the data as presented to the input of the data FEC encoder 34 is substantially random in pattern. The data FEC encoder 34 encodes the scrambled data pattern in a forward error correction code and subsequently interleaves the encoded data. Any forward error correction code, for example, a Reed-Solomon, or both a Reed-Solomon code and a convolution code, can be used for this purpose. The modulator 36 reads the FEC encoded data and FEC encoded control information from the frame control FEC encoder 38, and modulates the encoded packet data and control information onto carriers in OFDM symbols in accordance with conventional OFDM modulation techniques. Those modulation techniques may be coherent or differential. The modulation mode or type may be Binary Phase Shift Keying with ½ rate coding ("½ BPSK"), Quadrature Phase Shift Keying with ½ rate coding ("½ QPSK"), QPSK with ¾ rate coding ("¾ QPSK"), among others. The IFFT unit 42 receives input from the modulator 36, the frame control FEC encoder 38 and synchronization signal generator 40, and provides processed packet data to post IFFT functional units (not shown), which further process the packet data before transferring it to the AFE unit 26 (from FIG. 1).

The Tx configuration unit 52 receives the control information from the PHY-to-MAC I/F 74. This control information includes information about the channel over which data is to be transmitted from the MAC interface 74 and uses this information to select an appropriate channel (or tone) map from the channel maps memory 78. The selected channel map specifies a transmission mode, as well as a modulation type (including an associated coding rate) and set of carriers to be used for the data transmission, and therefore specifies OFDM symbol block sizes (both fixed and variable) associated with the transmission. An OFDM symbol block includes a plurality of symbols and may correspond to a packet or a portion thereof. The information read from the channel map is referred to herein as channel information. The Tx configuration unit 52 computes Tx configuration information from the channel information (i.e., channel map data). The Tx configuration information includes transmission mode, modulation type (including an associated FEC coding rate), number of symbols, number of bits per symbol, as well as number and size of Reed-Solomon blocks. The Tx configuration unit 52 provides the Tx configuration information to the PHY controller 76, which uses the information to control the configuration of the data FEC encoder 34. In addition to configuration control signals, the controller 76 also provides other conventional control signals to the data FEC encoder 34, as well as the scrambler 32, the modulator 36, the frame control FEC encoder 38, the synchronization signal generator 40 and the IFFT unit 42. The Tx configuration unit 52 also provides to the frame control FEC encoder 38 frame control information, such as delimiter type, e.g., start (start-of-frame), end (end-of-frame), and, if a start delimiter, a channel map index for conveying transmission mode and other information, as well as the number of OFDM symbols (to be transmitted) in a packet.

During a data receive process, OFDM packets transmitted over the channel to the receiving network node 12b by the transmitting network node 12a are received at the PHY unit 22 from the AFE unit 26 by the AGC unit 54. The output of the AGC unit 54 is processed by the FFT unit 58. The output of the FFT unit 58 is provided to the channel estimation unit 60, the synchronization unit 62, the frame control FEC decoder 64 and the demodulator 66. More specifically, phase and amplitude values of the processed packet data are provided to the channel estimation unit 60, which produces a new channel map that may be sent over the channel to the transmitting network node 12a. The channel map is used by both nodes for subsequent communications with each other in the same transmissions direction (that is, when node 12a is transmitting packet information to node 12b and node 12b is receiving packet information transmitted by node 12a). The Rx configuration unit 72 receives the channel map number and the number of OFDM symbols from the frame control FEC decoder 64, retrieves the channel map specified by the map number provided by the frame control FEC decoder 64, and provides Rx configuration information (derived from the channel map parameters) to the controller 76. The Rx configuration information is used to configure the data FEC decoder 68 and thus includes block size and other information necessary for decoding the packet. The synchronization unit 62 provides a start-of-packet signal to the controller 76. In response to these inputs, the controller 76 provides configuration and control signals to the data FEC decoder and to the demodulator 66. For example, it conveys the modulation type associated with the received packet data to the demodulator 66.

The demodulator 66 demodulates the OFDM symbols in the processed packet data received from the FFT unit 58 and converts phase angles of the packet data in each carrier of each symbol to metric values, which are used by the data FEC decoder for decoding purposes. The data FEC decoder 68 corrects bit errors occurring during transmission from the data FEC encoder 34 (of a transmitting node) to the data FEC decoder 68, and forwards the decoded data to the de-scrambler 70, which performs an operation that is the reverse of that which was performed by the scrambler 32. The output of the de-scrambler 70 is then provided to the MAC interface 74 for transfer to the MAC unit 18 (and, ultimately, to an application of the host computer 16).

For purposes of simplification and clarity, other details of the PHY unit's transmitter/receiver functional units (which are known to those skilled in the art and not pertinent to the invention) have been largely omitted herein.

Figure 3:
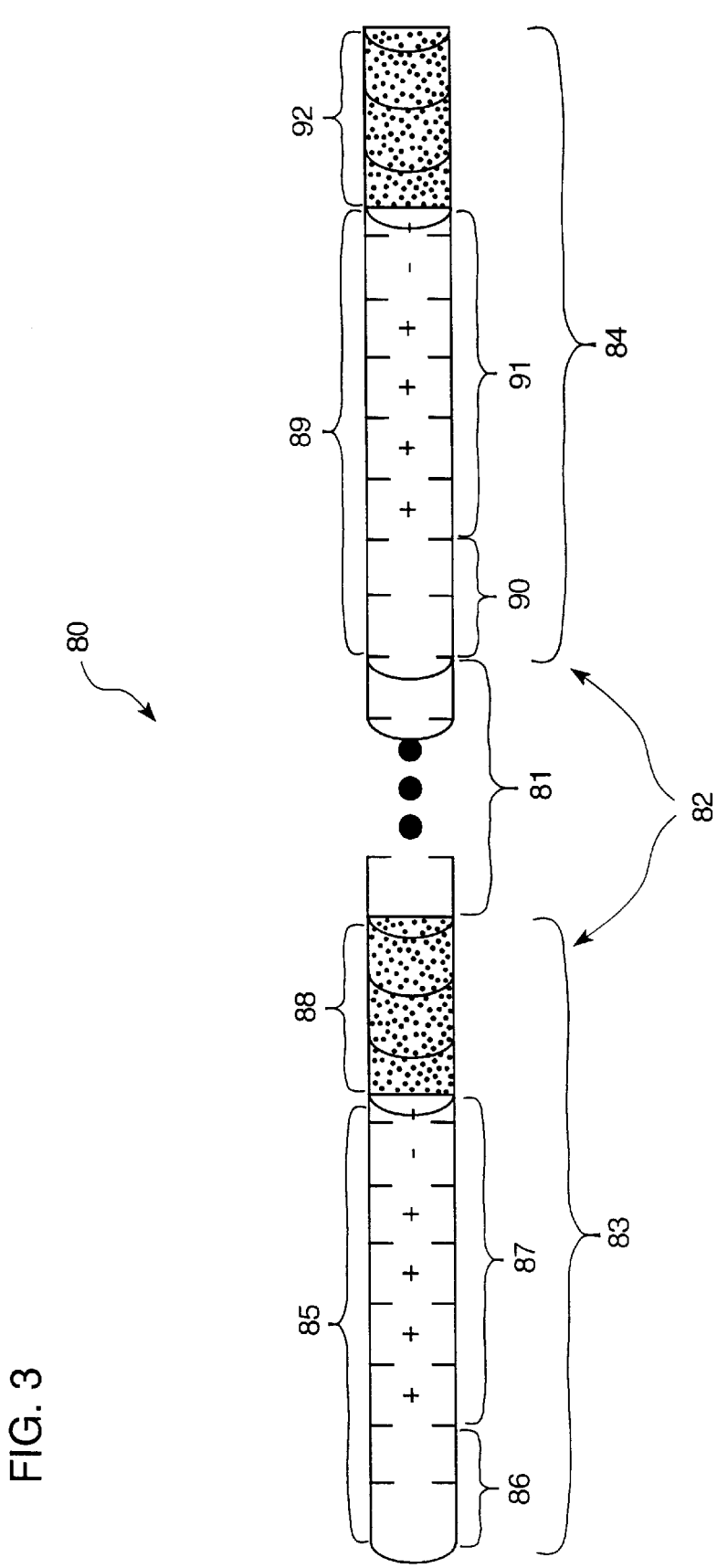
FIG. 3 is a depiction of a format of an OFDM frame.

Referring to FIG. 3, a format of a standard data transmission frame 80 to be transmitted over the transmission medium 14 by the transmitting network node 12a is shown. The data transmission frame 80 includes a payload (or body) 81, which carries the data received from the MAC. This data includes MAC Protocol Data Unit information, such as protocol header information, application data and check sequence. Preferably, the payload 81 is transmitted and received by the functional units illustrated in FIG. 2 in accordance with techniques described in co-pending U.S. patent application Ser. No. 09/455,186, entitled "Forward Error Correction With Channel Estimation," in the name of Lawrence W. Yonge III et al., co-pending U.S. patent application Ser. No. 09/455,110, entitled "Enhanced Channel Estimation," in the name of Lawrence W. Yonge III et al., and co-pending U.S. patent application Ser. No. 09/377,131, entitled "Robust Transmission Mode", in the name of Lawrence W. Yonge III et al., all of which are incorporated herein by reference; however, other techniques, including those described herein relative to frame control FEC encoding/decoding, may be used.

Still referring to FIG. 3, the frame 80 further includes delimiter information 82. The delimiter information 82 includes a delimiter that precedes the payload 81, that is, a start delimiter 83. Preferably, the delimiter information 82 also includes a delimiter that follows the payload 81, i.e., an end delimiter 84. The start delimiter 83 includes a first preamble 85, which includes first AGC and synchronization (SYNC) elements 86 and 87, respectively, and a first frame control field 88. The end delimiter 84 includes a second preamble 89 having a second (optional) AGC element 90 and a second SYNC element 91, as well as a second frame control field 92. The first frame control field 88 and the second frame control field 92 are produced by the frame control encoder 38 in conjunction with the modulator 36 based on control information received from the MAC unit 18. Generally, these frame control fields include symbols containing information necessary for network protocol operation and transmitter/receiver path characterization. More particularly, the frame control fields 88 and 92, respectively, carry the minimum information that must be heard by every node in the network so that proper synchronization of nodes across the network is maintained. Each frame control field identifies a delimiter type (e.g., start delimiter, end delimiter) and provides other information appropriate to the identified type. For example, in the first frame control field 88, the other information can include information that specifies how the data is to be demodulated, a channel map number, packet length, a start-of-packet indicator, timing information, and may include other information as well. The second frame control field 92 may be used for verification and to provide greater timing accuracy. The second frame control field 92 may include information included in the first frame control field, e.g., synchronization information (for nodes that did not hear a portion of or all of the first frame control delimiter 88), along with other channel access information such as control and timing information, an indication of whether or not a node may contend for access, packet transmission priority (e.g., to indicate whether or not a transmission stream can be interrupted), and an end-of-packet indicator. Generally, nodes other than the intended packet recipient cannot decode the packet body portion and thus use the frame control fields to determine when the transmission medium will be available for access so as to avoid collisions.

Although FIG. 3 illustrates delimiters encapsulating a packet body of a data transmission packet, the encoding and decoding mechanisms of the frame control FEC encoder 38 and frame control FEC decoder 64 may be used with other kinds of delimiters. For example, the receiving node (to whom the data transmission is directed) may send a response packet to the transmitting node if the original data transmission indicated that a response was required. The response packet may be a delimiter of a response type, thus formatted to include a preamble and a frame control field having a type indicating a response, e.g., an acknowledgement. The frame control field of the response delimiter can include synchronization information, as well as contention, priority and address information (the address information being used to identify the packet transmission to which the response belongs, that is, is responsive to), and an indication of the success or failure of that packet transmission. Other information may be included as well. Other exemplary delimiters may be associated with packets used to gain access to the channel, for example, "request-to-send " (RTS) packets, which may be used to reduce overhead caused by collisions occurring during heavy traffic conditions and thus improve network efficiency. The delimiter may be of a type that includes the kind of management information required by other media access mechanisms, such as TDMA (commonly used for isochronous traffic), and thus need not be contention-oriented. For example, a TDMA network transmission could include a beacon type of delimiter (beacon delimiter) to maintain network synchronization and manage when each node should transmit and receive packets. Therefore, it will appreciated that the frame control encoding/decoding mechanisms described herein relative to the first frame control field 88 of the start delimiter are applicable to other possible delimiter types, including but not limited to end types, responses, RTS types and beacons, as discussed above. The symbols of the frame control fields in such delimiters are protected from transmission errors by a block code enhanced with time and frequency domain interleaving, as well as redundancy, as will be described. In one illustrated embodiment, the number of symbols in each frame control field is chosen to be three; however, other frame control field sizes (e.g., four symbols) may be used.

Accordingly, and with reference to FIG. 4, the frame control encoder 38 includes a block code encoder shown as a product encoder 100 and an interleaver 102. The product encoder 100 receives 25 information bits from the Tx configuration unit 52 (shown in FIG. 2) for each frame control field processing. The product encoder 100 encodes the 25 information bits by a ¼ rate product code to produce 100 coded bits. The product encoder 100 transfers the 100 coded bits to the interleaver 102, which includes a frequency interleaving process 104, and a time-interleaving and copying process 106. These processes operate on the coded information bits to produce coded information bits that are interleaved so as to result in significant time and frequency spreading, as well as redundancy. Such interleaving thus provides substantial error correction capability in either the frequency or time domain. The interleaved data, a total of 252 bits for three 84-carrier OFDM symbols, is coherently BPSK modulated onto three OFDM symbols by the modulator 36, from FIG. 2 (shown here in dashed lines). The frame control symbols of the first frame control 88 (and the second frame control 92, if an end delimiter is used) are inserted in the packet to be transmitted over the channel according to the format shown in FIG. 3.

The 25 frame control information bits are encoded by the product encoder 100 with a (100,25,16) product code to produce the 100 encoded bits. The product code itself is derived from a (10,5,4) shortened extended hamming code. The product code terms (n,k,w) specify a block size, information size and minimum hamming distance, respectively.

Figures 5, 6:
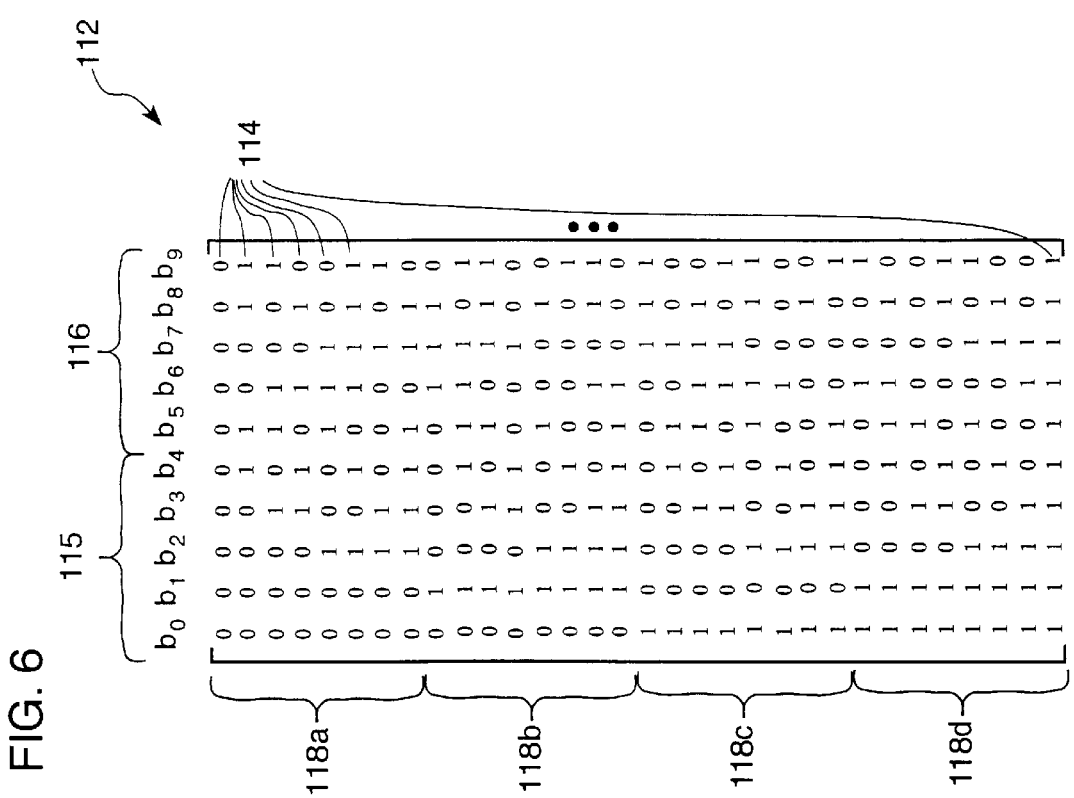
FIG. 5 is a generator matrix selected to produce a set of code words having properties of symmetry.
FIG. 6. is a codeword table containing the set of code words produced by the generator matrix of FIG. 5.

Referring to FIG. 5, the (10,5,4) hamming code is generated by a generator matrix G 110. Although different generator matrices may be chosen to produce a set of code words with the same hamming distance, the generator matrix 110 is selected to achieve symmetrical properties of the code word set so that the implementation of a soft-in/soft-out decoder for decoding the coded frame control information may be simplified, as will be described.

Referring to FIG. 6, the generator matrix 110 (from FIG. 5) is applied to the frame control information bits to produce a complete set of code words 112. The code word set 112 includes $2^5$ code words 114, each of which includes five information bits and five parity bits, The information bits correspond to the first five bits (indicated as $b_o$ through $b_4$) 115 and the parity bits correspond to the remaining five bits (shown as $b_5$ through $b_9$) 116. The parity bits $b_5$ through $b_9$ 116 are produced according to the following logic expressions:

$b_5 = b_2 \oplus (b_3 \oplus b_4)$;

$b_6 = b_3 \oplus (b_1 \oplus b_2)$;

$b_7 = b_0 \oplus (b_1 \oplus b_2)$;

$b_8 = b_4 \oplus (b_0 \oplus b_1)$; and $b_9 = b_0 \oplus (b_0 \oplus b_4)$;

where the operator symbol "$\oplus$" represents an exclusive-OR function.

The symmetric properties of the code set 112 can be appreciated by viewing the set 112 as four "regions", a first region 118a corresponding to code words 0 through 7, a second region 118b corresponding to the next 8 code words, or code words 8 through 15, a third region 118c corresponding to code words 16 through 23, and a fourth region 118d, corresponding to the last 8 code words (code words 24 through 31). It may be observed that the top half of the code set, i.e., regions 118a and 118b, and the bottom half of the code set, i.e., regions 118c and 118d, are symmetric, but the inverse of each other. Additional symmetry properties can be observed with respect to regions 118a and 118b, and regions 118a and 118c, as well. For example, region 118b is the mirror image of region 118a with respect to bits $b_0$, $b_7$–$b_9$. Also, bits $b_1$ through $b_6$ are the same in the corresponding code words of regions 118a and 118c (e.g., last codeword, codeword 7 in region 118a and codeword 15 in region 118c). These symmetric properties will be discussed in more detail with reference to the description of the delimiter decoder 64 (FIG. 2).

Figure 7:
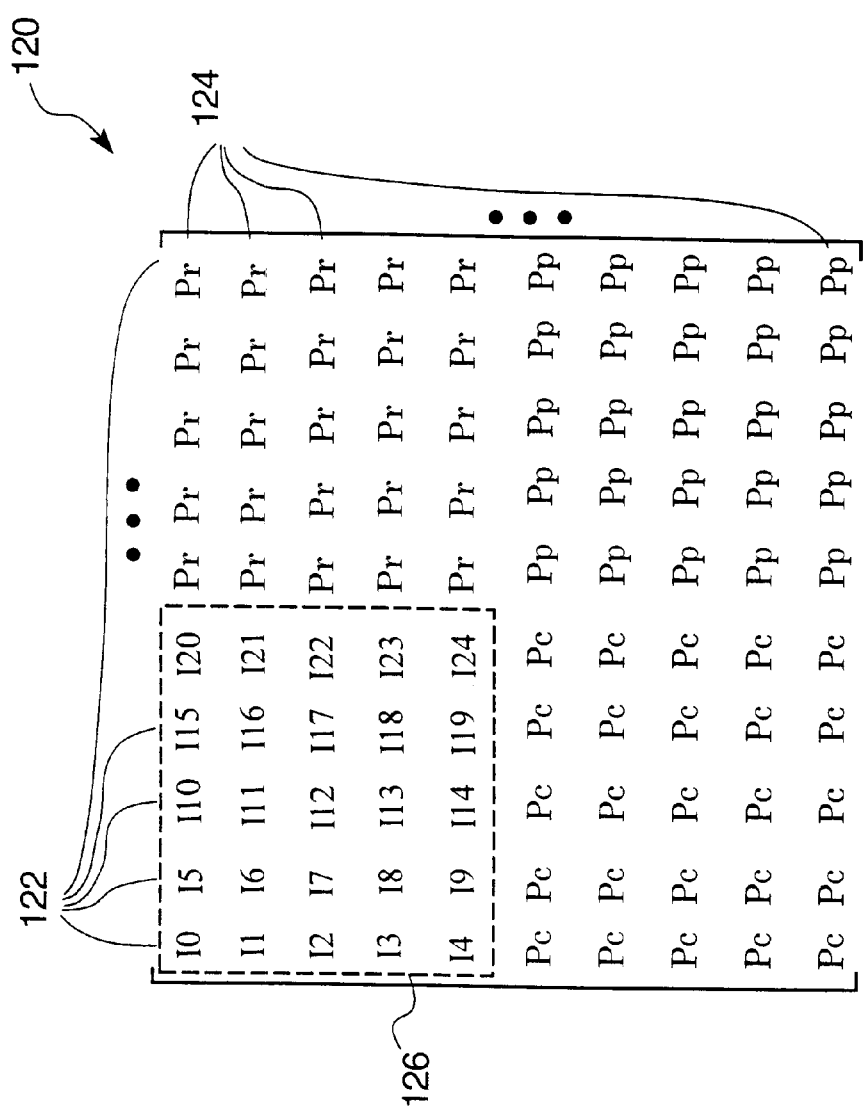
FIG. 7 is a two-dimensional product code block produced for a first twenty-five information bits of the set of code words of FIG. 6.

Referring to FIG. 7, encoding of the (100,25,16) code block by the product encoder 100 (of FIG. 4) produces a product code block 120 arranged as a matrix having 10 rows 122 by 10 columns 124. The product code block 120 is formed in the following manner. The 25 information bits are placed in a 5 row by 5 column information matrix 126, a sub-matrix within the final 10 row by 10 column matrix. The first 5 information bits (I0–I4) are placed in the first column, the second 5 information bits (I5–I9) are placed in the second column, and so forth. The first five of the rows 124 each is encoded to produce five parity bits Pr (parity by row) for that row. Each of the ten columns 122 is encoded to produce five parity bits Pc (parity by column, for the first five columns of information bits) and Pp (parity on parity, for the last five columns of Pr bits) for each column. Thus, in the product code block 120, each row 124 corresponds to a horizontal codeword and each column 122 corresponds to a vertical codeword. It will be appreciated that the parity generation is a matrix multiplication:

$G_T * I * G$, where G is the generator matrix, $G_T$ is the transpose of the generator matrix G, and I is the information matrix. Additional information about linear block codes, such as hamming codes and product codes, may be had with reference to a well-known text by W. Wesley Peterson and E. J. Weldon, Jr., entitled "Error-Correcting Codes (The MIT Press, 1972)."

For a hamming distance of 4, the selected product code can correct less than 2 bit errors. When a code word received by a receiving network node has, for example, one bit error, and is correlated against all of the code words in the set 112 (shown in FIG. 5), the frame control FEC decoder 64 can select the closet code word (the one with the best correlation value) correctly. Therefore, if the number of bit errors is less than two, the product code can correct every single row and completely recover any data as long as there is only one bit error in each row or column.

To achieve a more robust transmission, one capable of withstanding a greater number of bit errors in each code word, therefore, the interleaver 102 is designed to interleave code words in time and frequency, and with some degree of redundancy, so that multiple bit errors caused by typical error events, e.g., frequency nulls, jammers, impulse noise, occur on diagonals (of the product code block 120) only.

Figure 8:
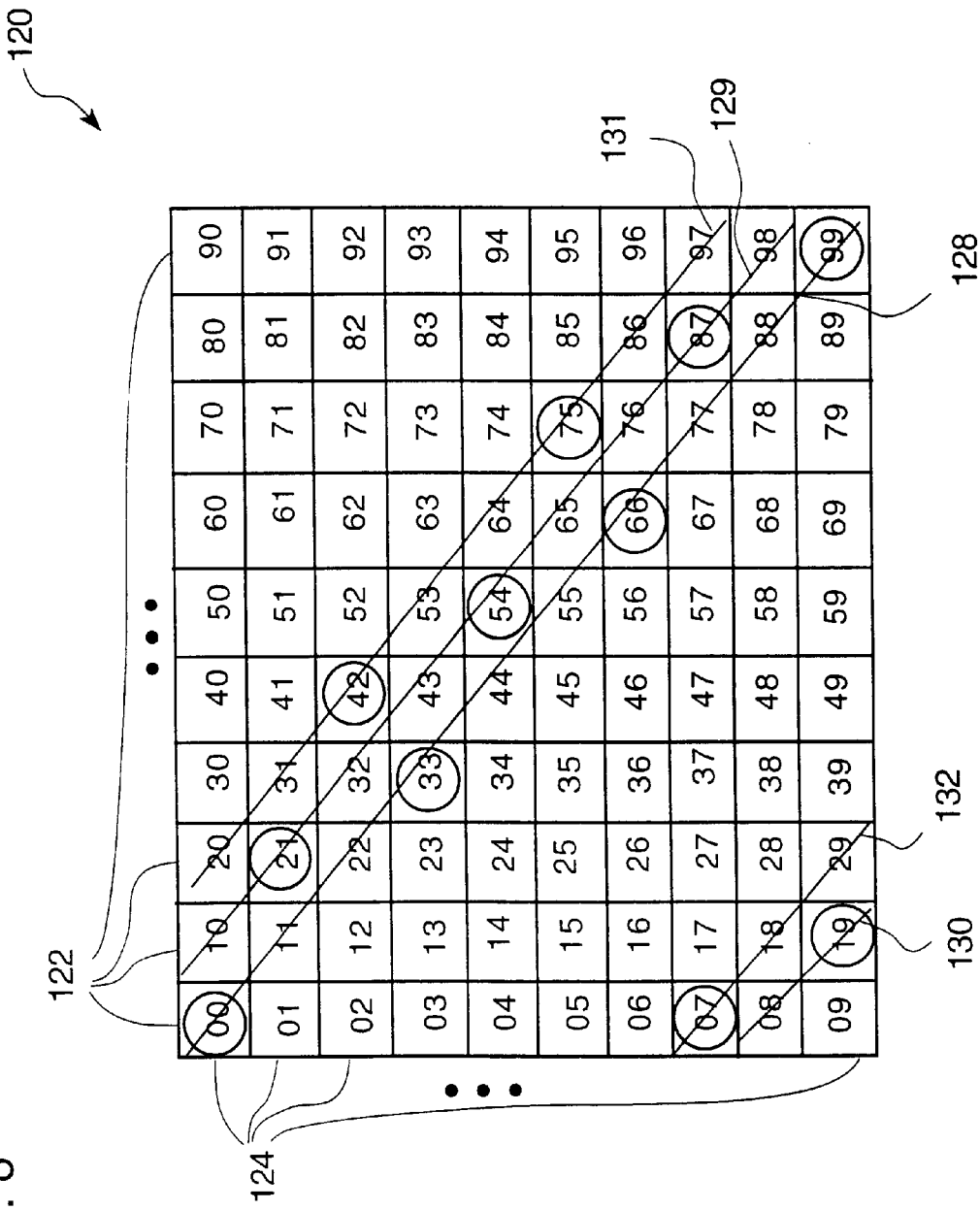
FIG. 8 is an alternative depiction of the product code block (of FIG. 7), with each of the 100 block elements labeled with (column, row) indices from 00 to 99.

Referring to FIG. 8, to better illustrate the interleaving process, the product code block or matrix 120 (of FIG. 7) is alternatively represented as a vector 55 of 100 elements 120. The first 10 vector elements correspond to the first column 122 (with the first item in the first column of the product code block 120 mapping to the first element in the vector 120), the second 10 vector elements corresponding to the second column 122, and so on. The interleaver 102 re-orders the 100 elements (elements 0 through 99) in the vector as a new, frequency-interleaved vector Vi by selecting elements along diagonals, e.g., diagonals 128, 129, 130, 131, 132, until all 100 elements have been selected.

Figure 9A:
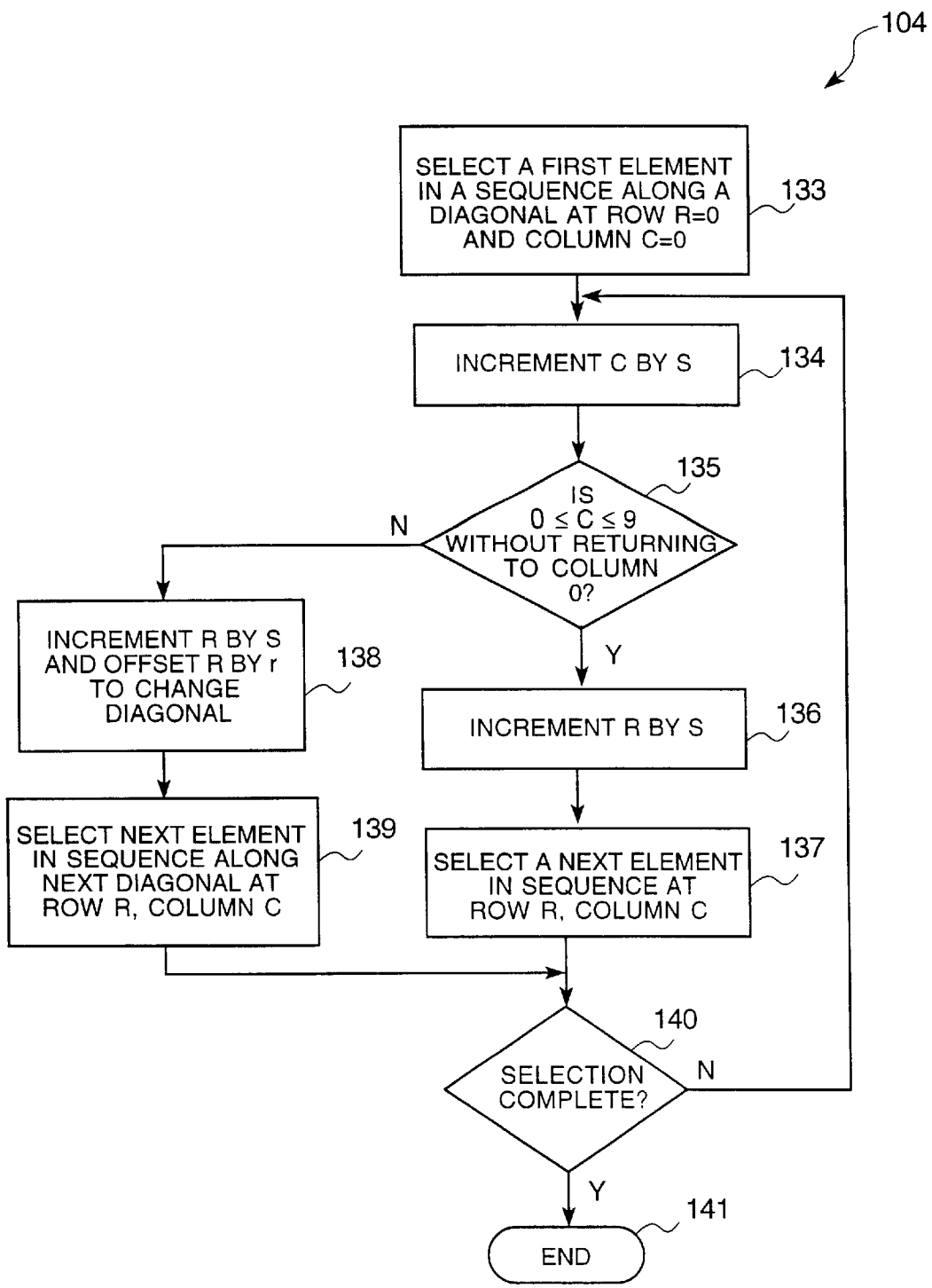
FIGS. 9A–B are flow diagrams of the frequency interleaving process for three symbols of frame control information.

Referring to FIG. 9A, the frequency interleaving process 104 for producing a new vector that includes diagonal sequences of elements within the product code block 120 is shown. The process 104 begins a first diagonal sequence selection by selecting a first element in a first sequence along a diagonal beginning at a first row, row value R=0, and a first column, column value C=0 (step 133). The process adds a value S to the column value (step 134) and determines if the resulting column value is greater than the largest column value (i.e., 9), thus requiring a return (or rollover) to the first column, column 0, in order to advance the column position by S columns (step 135). If the column value is within the range of integers from 0 to 9 without returning to column 0, the process also adds S to the row value (step 136), and selects as a next element the element corresponding to the column C and row R (step 137). If the column value does exceed the maximum number of columns, the process offsets the value of S that is added to the row by a row offset value r to direct the element selection to a next sequence along a next diagonal (step 138) and, as above, selects as a next element in a sequence along the next diagonal the element corresponding to the column C and row R (step 139). After each element selection (steps 137, 139), the process determines if the all of the 100 elements of the original vector have been selected (step 140). If so, the process terminates (step 141). If not, the process continues with the next element selection at step 134.

Figure 9B:
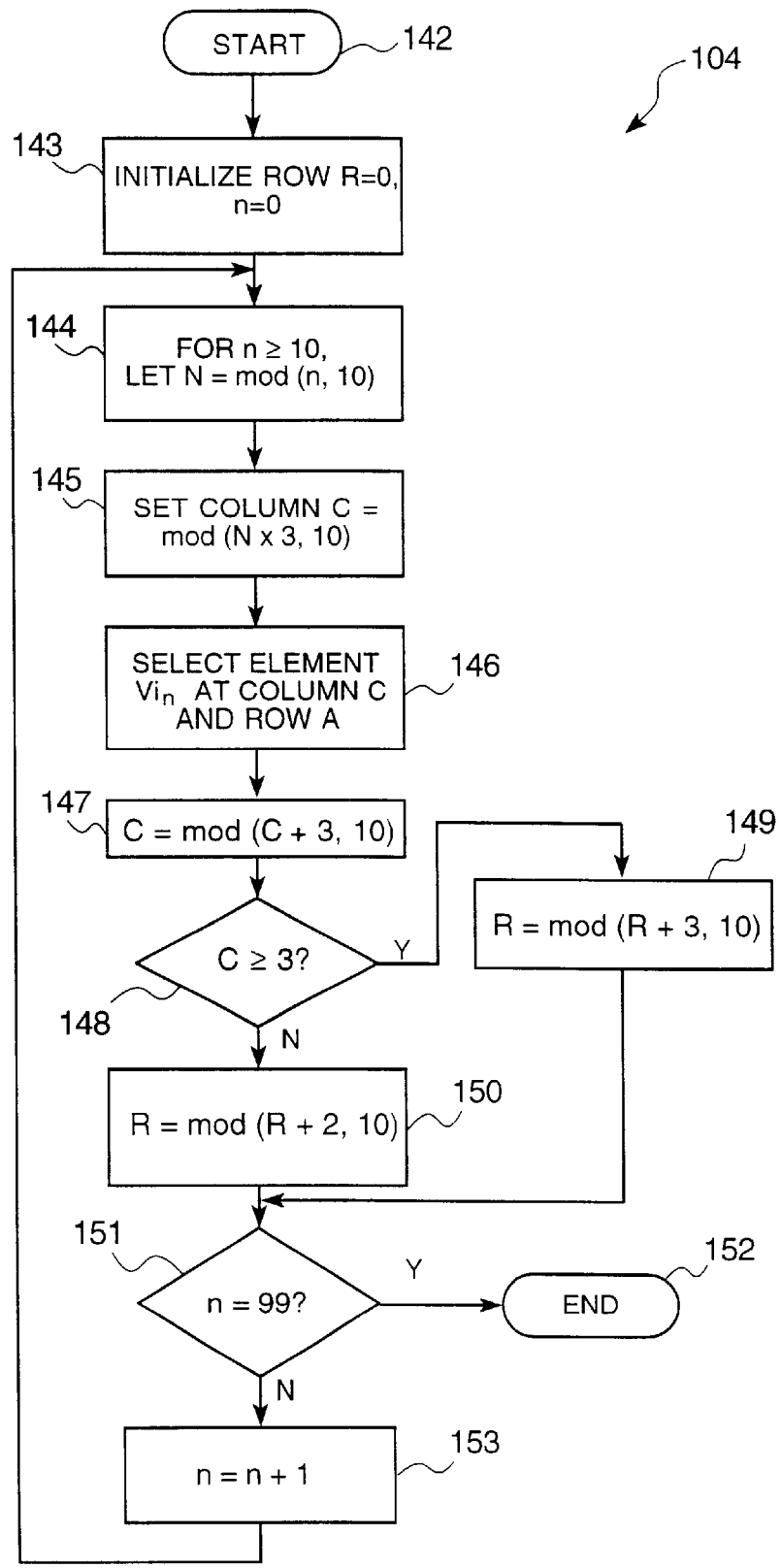

Referring to FIG. 9B, for a row/column incrementing value of S equal to 3 (to correspond to the number of frame control delimiter symbols) and a row offset r of −1, an exemplary algorithm for the frequency-interleaving process 10 4 for re-ordering the 100 element vector V (i.e., the 100 item product code block) to form the new, frequency-interleaved vector Vi is shown. The process uses the well-known arithmetical notion of congruence to maintain the row and column values in the set of integer values 0, . . . , 9. Thus, any value of 10 or greater is replaced by the remainder of that value divided by 10 . It is said that the remainder and the value are congruent modulo 10 , e.g., 4 and 24 are congruent modulo 10 or, in short-hand notation, 4=mod (24,10). The process 104 begins (step 142) by initializing a row R to 0 and an element number n (where n ranges from 0 to 99) to 0 (step 143). For values of n greater than or equal to 10, the process determines mod(n, 10) and saves the mod(n,10) value as N (step 144). The process determines the product of N times a value S=3 (i.e., N*3) and sets the column C equal to mod (N*3, 10) (step 145). The process 104 selects an element $Vi_n$ at the column C and row R (step 146). The process updates C as mod(C+S, 10 ), where S=3 (step 147), and determines if C is greater than or equal to S=3 (step 148). If it is determined that C is greater than or equal to 3, then the next element selection is along the same diagonal as the previously selected element and the process sets R to the value of mod(R+S,10), where S=3 (step 149). If it is determined at step 148 that C is less than 3, then the process changes diagonals by setting R to the value of mod(R+(3−1),10), where −1 is the row offset (step 150). The process determines if the number of selected elements n is equal to 99 (step 151) If n is determined to be equal to 99, then all of the 100 elements have been selected for the interleaved vector and the process terminates (step 152). If n is not equal to 99, then the value of n is incremented by 1 (step 153) and the process returns to step 146 to perform the next element selection.

Referring back to FIG. 8, and using the technique illustrated in FIGS. 9A–B, an example of a selection of elements along a first five diagonals is as follows. A first diagonal sequence along a first diagonal corresponding to the diagonal 128 is formed by adding 3 to the row and column values to select the elements 00, 33, 66 and 99. Adding 3 to the column value 9 results in a"rollover" column value (that is, mod(12,10) of 2, so a value of 3−1=2 is added to the row to give a row value of mod(11,10), or 1, for a next element selection of element 21 (column 2, row 1) along a new, second diagonal corresponding to the diagonal 129. The process continues to add 3 to the row and column values (to select elements 54 and 87) along the diagonal 129 until the process again determines that adding 3 to the column value causes a rollover in the column values to a column value 1, further resulting in an offset row value of 9. Consequently, the process selects the next element at a new, third diagonal corresponding to the diagonal 130 at element 19 and again changes diagonals after the selection of element 19 to select elements from a fourth diagonal corresponding to the diagonal 131, beginning with element 42 and including element 75. Again the process changes diagonals to proceed to a fifth diagonal corresponding to the diagonal 132 and selects from that diagonal element 07, corresponding to column 0 and row 7. The process continues the element selection along successive diagonals in this manner until all of the 100 elements in the matrix 120 have been selected. It will be appreciated that the overall effect of the technique is to select a first element on the main diagonal 128 and, subsequently, every third element along successive diagonals until every consecutive element in every diagonal in the matrix 120 is selected.

Figure 9C:
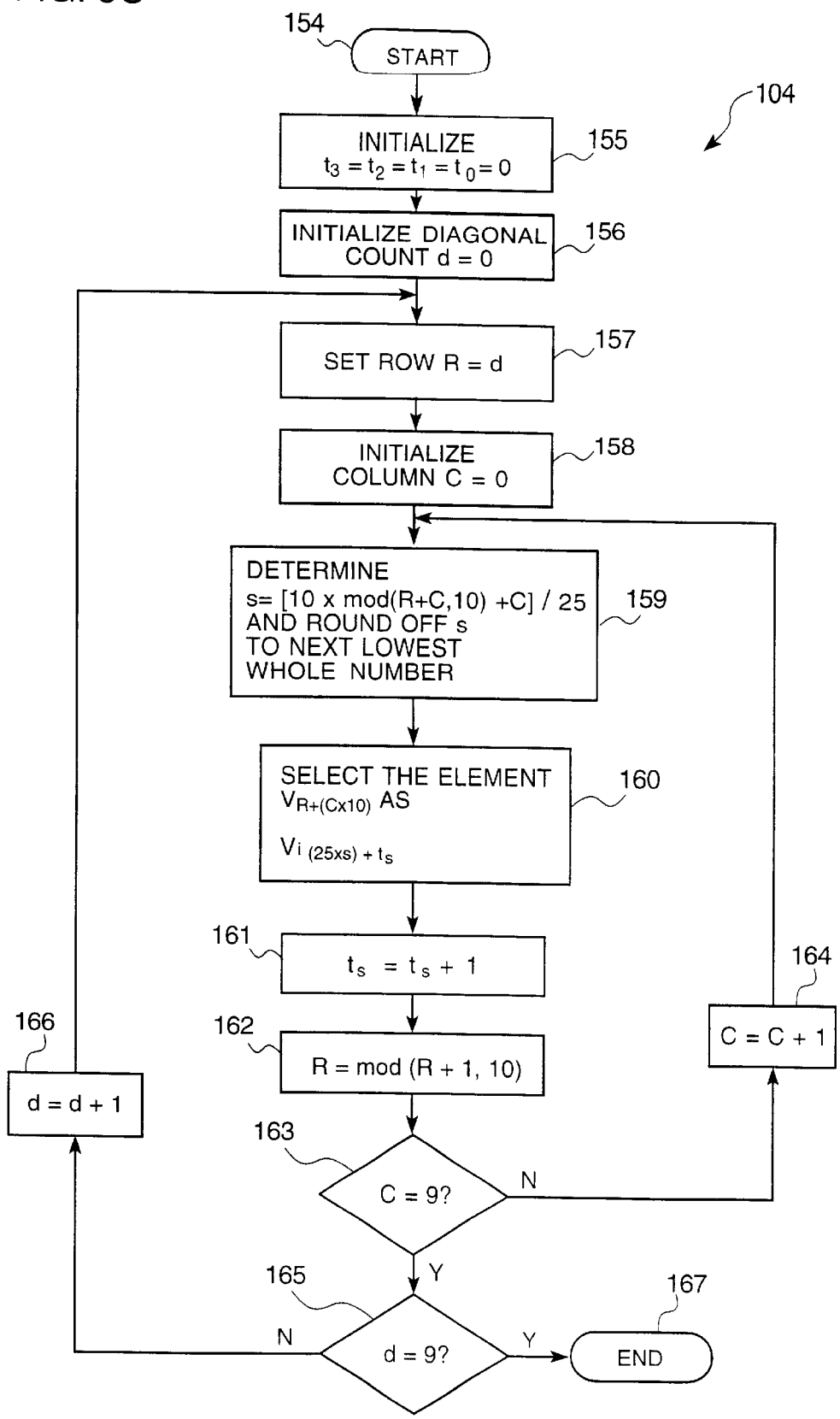
FIG. 9C is a flow diagram of the frequency interleaving process for four symbols of frame control information.

Alternatively, and as mentioned above, the frame control information can be defined to include a number of symbols other than three. Therefore, the interleaving/copy processes 104 may be suitably adapted for use with a different number of symbols, for example, 4 symbols. Referring to FIG. 9C, a exemplary four-symbol implementation of the frequency-interleaving process 104 for re-ordering the 100 element vector V (i.e., the 100 item product code block) to form the new, frequency-interleaved vector Vi is shown. For purposes of V-to-Vi re-ordering, the 100 element vector Vi is viewed (and populated) as an array of 4 columns of 25 rows. The 4×25 array is referred to herein as an intermediate array so as to distinguish it from the 10×10 array associated with the original vector V. Thus, the new ordering of Vi is determined by the placement of selected vector V elements within the intermediate array in groups of adjacent rows (and not the order of the selection of vector V elements, as in the 3-symbol interleaving process of FIGS. 9A–B). A value s (0,1,2,3) denotes an intermediate array column value and a value $t_s$ (where s=0,1,2,3) denotes an intermediate array row value for a selected value of S.

Still referring to FIG. 9C, the process 104 begins (step 154) by initializing the intermediate array row values $t_3=t_2=t_1=t_0$ to zero (step 155) and a diagonal count value d to zero (step 156). The process also sets the row value R equal to d (step 157) and initializes the column value C to zero (step 158), where R and C refer to rows and columns (respectively) of the original 10[33] 10 matrix (as shown in FIG. 8). The process determines the intermediate array column value s by finding a sum of [10*mod(R+C, 10)]+C, dividing the sum by twenty-five and rounding off the resulting value to the next lowest whole number (step 159). The process selects from a diagonal in the original vector V the element V[R+(C*10)] as the interleaved vector element Vi[(25*s)+$t_s$] (step 160). Once the element selection has been made, the intermediate array row value $t_s$ is incremented by one (step 161) and the value of R is updated by mod(R+1,10) (step 162). The process determines if C is equal to 9 (step 163). If it determines that C is not equal to 9, it increments the value of C by one (step 164) and returns to step 159. If, at step 163, the process determines that C is equal to 9, then it determines if all ten diagonals have been processed (i.e., d=9) (step 165). If it is determined at step 165 that d is less than 9, then the process changes diagonals by incrementing d by one (step 166) and returning to step 157 to set R=d and proceeds to process a next diagonal of elements in the vector V. If d is equal to nine, then all 10 diagonals (and all 100 elements) have been selected for the interleaved vector Vi and the process terminates (step 167).

Referring to FIGS. 8 and 9C, the placement of the diagonal elements of vector V in vector Vi according to the process 104 of FIG. 9C is as follows. For d=R=C=0, is determined to be equal to 0 (at step 159). Thus, the first element along the main diagonal 128 (FIG. 8), that which corresponds to $V_{R+(C*10)}=V_{00}$, is selected as $Vi_{25*s+ts}=Vi_{00}$ (at step 160). The values of $t_o$ and R are increased to 1 (at steps 161–162). Since C is not equal to 9 (at step 163), the value of C is increased to 1 (at step 164). The value of s is computed as 0 (at step 159) and the element selection computations are repeated to yield a selection of $V_{11}$ (the second element along the main diagonal) as $Vi_{(25*0)+1}$, or $Vi_{01}$ (at step 160). For the next element along the main diagonal, where R=2 and C=2, s is computed to be 1 (at step 159) and t, is equal to $t_i$, which is 0 (as initialized at step 155). Thus, $V_{22}$ is selected as $Vi_{25}$ (at step 160). The value of t, is incremented to 1 (step 161) and R to 3 (step 162). Steps 159–163 are repeated until C=9, at which point all elements in the first diagonal of the original 10×10 array for V have been selected for placement in Vi. Thus, $V_{33}$ is selected for $Vi_{50}$, $V_{44}$ for $VI_{75}$, $V_{55}$ for $Vi_{02}$, $V_{66}$ for $VI_{26}$, $V_{77}$ for $Vi_{27}$, $V_{88}$ for $Vi_{51}$, and $V_{99}$ for $Vi_{76}$. For the next diagonal, d=1 (step 166), R is set equal to d (step 157) and C is again initialized to 0 (step 158). It should be noted that $t_3$, $t_2$, $t_1$ and $t_o$ are not reset when d changes, but instead retain their current values. Thus, for s=0 (at step 159) and $t_0=3$ (the value of $t_o$ to after the previous 10 selections), $V_{01}$ is selected as $Vi_{03}$ (step 160). Continuing along the current diagonal, $V_{12}$ is selected for $Vi_{28}$, $V_{23}$ is selected for Vi52, and so forth. The process performs element selections along diagonals until all 100 elements have been selected for Vi.

The frequency-interleaved vector data Vi is spread among the carriers of the frame control symbols by the interleaver 102 according to the time-interleaving/copying process 106 in such a way as to ensure that diagonal groupings occur across consecutive symbols as well. Assuming 84 available carriers, the total interleaving for the frame control information requires a total of 252 bits to fill 3 symbols (or a total of 336 bits to fill four symbols), providing redundancy for the 100 encoded information bits. As the number of available carriers decreases, the number of required bits decreases, thus reducing the level of redundancy.

Figure 10:
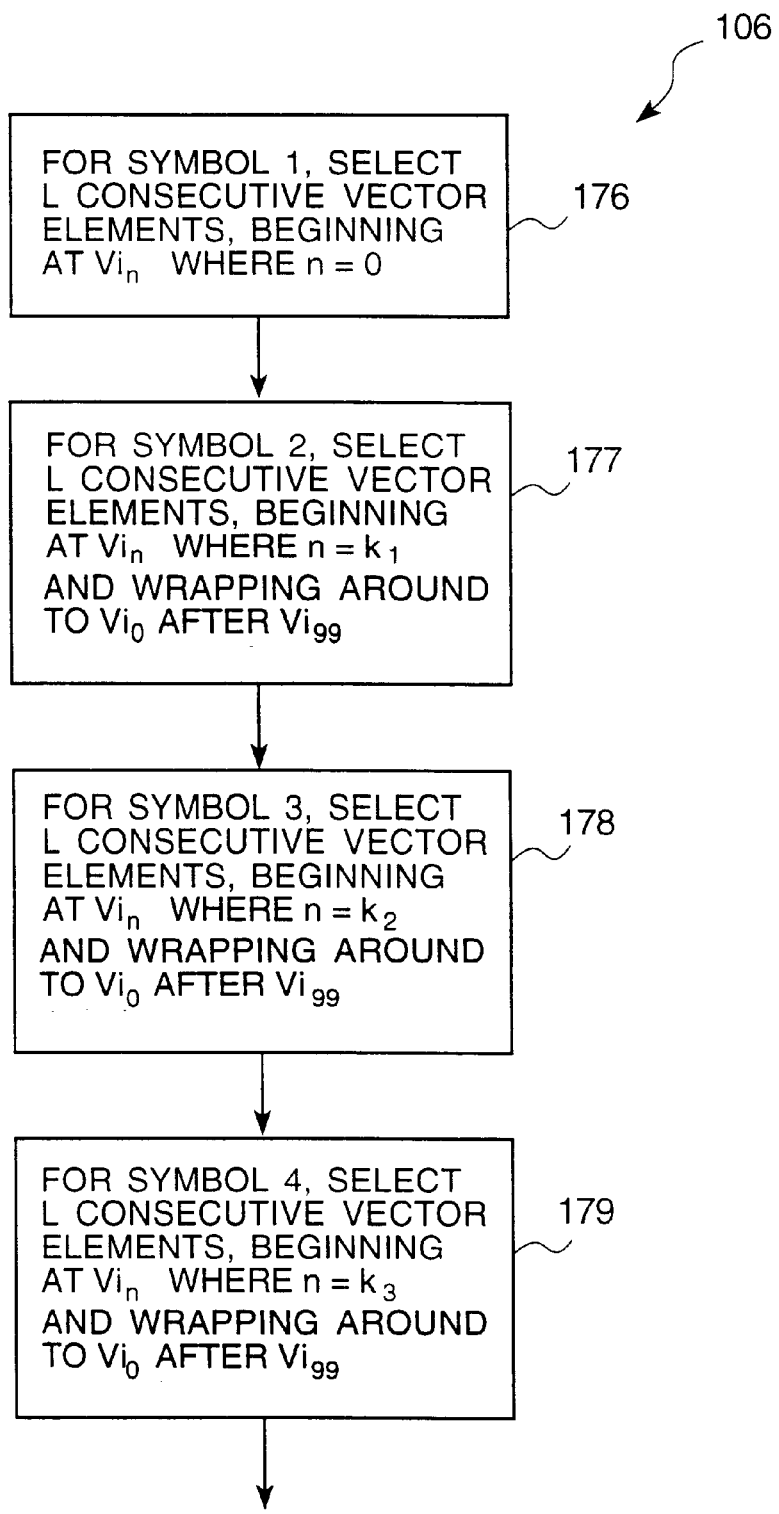
FIG. 10 is a flow diagram of the time interleaving/copying process for as many as four symbols.

Referring to FIG. 10, the time-interleaving/copy process 106 selects a number of consecutive vector elements corresponding to the number of available carriers (L) from the interleaved vector Vi for frame control symbol 1 beginning at $Vi_0$ (step 176). The process again selects the same number of consecutive vector elements from the interleaved vector for frame control symbol 2, but beginning at a value of n equal to a first offset value $k_1$ and wrapping around to the first element $Vi_0$ after the last vector element $Vi_{99}$ (step 177). In a third pass or selection, for frame control symbol 3, the process selects L consecutive vector elements beginning at a second offset value $k_2$ and wrapping around to the first element $Vi_0$ after the last vector element $Vi_{99}$ (step 178). For a fourth symbol (if used), the process selects L consecutive vector elements beginning at a third offset value $k_3$ and wrapping around to the first element $Vi_0$ after the last vector element Vigg (step 179). Preferably, the offsets are chosen based on the total number of OFDM symbols to result in diagonal element groupings across groups of adjacent carriers across all frame control symbols. Thus, where the number of OFDM symbols is three, $k_1$ is equal to 67 and $k_2$ is equal to 34. Alternatively, if the number of OFDM symbols is chosen to be four, the offsets are selected as $k_1=25$, $k_2=50$ and $k_3=75$.

The resulting data carrier assignment for the three frame control symbols 1, 2 and 3 organized according to processes 104 (as depicted in FIGS. 9A–9B for three symbols) and 106 (steps 177–178, where $k_1=67$ and $k_2=34$, for three symbols) is depicted in FIG. 11A. The value in each symbol column represents the element number (or index) of the product code vector V prior to the interleaving of the elements of that vector. The figure clearly illustrates the intra-symbol diagonal groupings (i.e, the diagonal sequences based on the selection of every third element along diagonals) as well as the diagonal groupings within carriers (all, and in this case, consecutive, elements along diagonals) across adjacent successive symbols, or inter-symbol diagonal groupings. Thus, as many as 10 bits of error (such as frequency errors) occurring on any diagonal, that is, any ten elements not on the same row and same column, can be recovered because only 1 bit of error is contained in each row and each column. It is also important to note that a diagonal grouping that spans the three symbols at one carrier continues to span the three symbols in adjacent carriers. For example, consecutive elements along the diagonal 128 (from FIG. 8), i.e., elements 00, 11, 22, 33, 44, 55, 66, 77, 88, 99, are grouped together on carriers 0, 1, 2 and 3. Thus, in addition to fixing errors spanning the diagonals in a carrier (across symbols) or in a symbol, it would be possible to lose any one or more of carriers 0, 1 and 2 and recover the information on those carriers. Also, data on an entire corrupted symbol may be recoverable due, in part, to the diagonal groupings within the symbol, as well as to the data copies residing on the other two symbols as a result of the time interleaving/copying process 106.

Referring to FIG. 11B, an exemplary four-symbol data carrier assignment resulting from the process 104 (as depicted in FIG. 9C for four symbols) and process 106 (steps 176–179, where $k_1=25$, $k_2=50$ and $k_3=75$, for four symbols) is shown. In this particular carrier assignment, like the carrier assignment of FIG. 11A, one can observe the diagonal groupings of elements within each of the symbols (e.g., the diagonal sequence of elements 0, 11 and 55 from the main diagonal on symbol 1) as well as the diagonal groupings within carriers and groups of carriers across adjacent successive symbols (e.g., the grouping together of all of the main diagonal elements on symbols 1–4 and carriers 0–2).

It will be appreciated that carriers may be disabled or masked as unusable. If one or more of the total available carriers in the delimiter symbols are masked, the interleaved data is spread among the unmasked carriers. The masked carriers are skipped as the elements of Vi are placed on each of the symbols. That is, each element intended for a carrier that has been masked is instead placed on the next unmasked carrier.

Referring back to FIGS. 1 and 2, the interleaved 84 bits read for each of the symbols of 84 carriers by the interleaver 102 are modulated onto their respective frame control symbols by the modulator 36 using coherent BPSK modulation and subsequently transmitted to a receiver node over the transmission channel. In the receiving node, the demodulator 66 demodulates the modulated carriers in each of the frame control symbols using a scheme appropriate to the modulation technique used by the modulator 36. Each frame control symbol is coherently demodulated by differential demodulation relative to a phase reference that is computed from synchronization position information supplied by the synchronization unit 62. The demodulator 66 produces for each bit of the transmitted carrier data a phase or soft decision value (hereinafter, "soft value") represented by an 8-bit unsigned number in the range of 0 to 255, where $128=\pi$. If the phase is greater than or equal to 128, the demodulater subtracts the phase from 192. If the phase is less than 128, the demodulator subtracts a value of 64 from the phase. This results in a phase numbers with values of either +64 or −64 in absence of noise. The output of the demodulator for the entire delimiter, therefore, is a maximum set of soft values, i.e., 252 soft values based on 3 symbols of 84 carriers (or 336 soft values based on 4 symbols of 84 carriers). Each soft value represents for the bit of the carrier data from which it is derived a probability that such bit is a "0" or "1".

Figure 12:
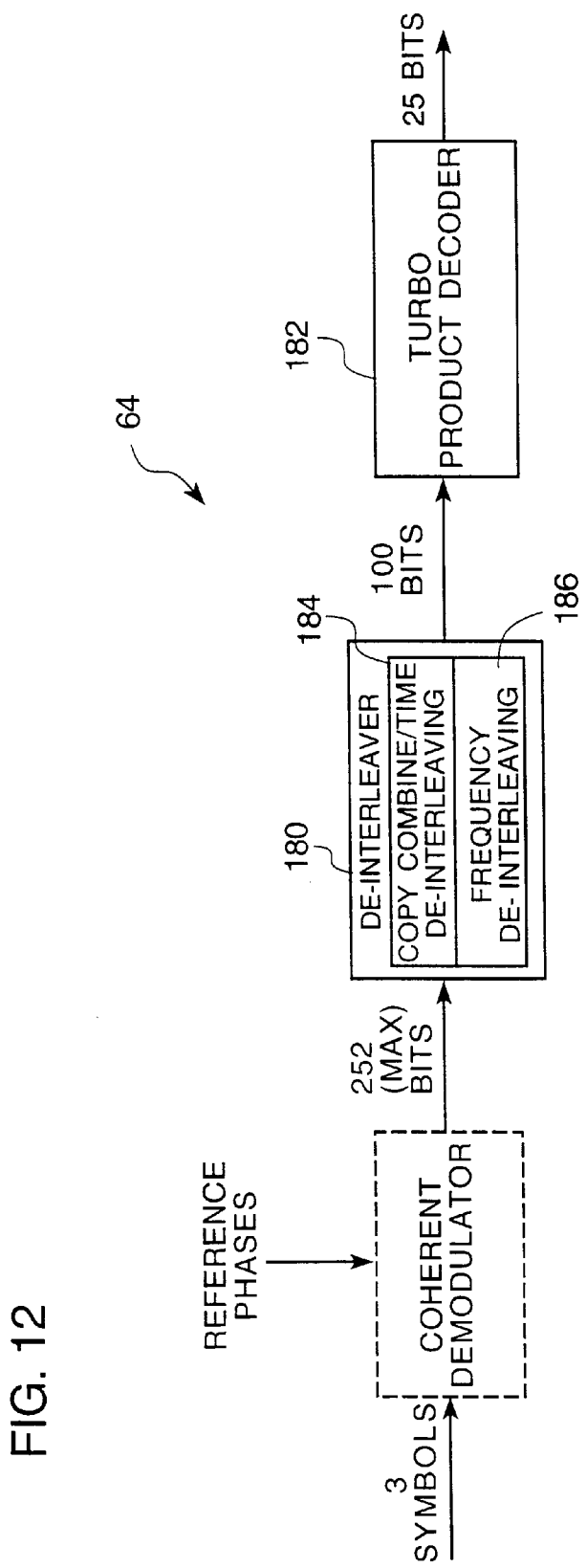
FIG. 12 is a block diagram of the frame control decoder of FIG. 2 including a de-interleaver (for supporting copy combining and time/frequency de-interleaving) and a turbo product decoder.

Referring to FIG. 12, the frame control decoder 64 includes a de-interleaver 180 and a product decoder shown as a turbo product decoder 182. The de-interleaver 180 includes a copy combining and time de-interleaving process 184 and a frequency de-interleaving process 186. The de-interleaver 180 receives the 252 demodulated soft values (from the coherent demodulator 66, from FIG. 2, and shown here in dashed lines) and operates on the soft values as a group. The de-interleaver 180 uses the reverse operation to that applied by the interleaver to the product code block during the interleaver processes to recover the original sequence of the 100 encoded soft values. Thus, the set of 252 soft values are received by the de-interleaver 180 according to the carrier assignment depicted in FIG. 11A. The process 184 reverses the time spreading and combines soft value copies for each of the 100 bits by accumulating the soft value copies and dividing the sum by the number of occurrences (that is, averaging the copy values). It should be noted that, due to the nature of the time-interleaving/copy process, not all of the 100 codeword bits are represented an equal number of times over the span of the three frame control symbols.

It may be desirable to combine the copies in a way that takes into account the quality of the carriers and symbols. For example, instead of determining a straight average as described above, the process can determine a weighted average based on phase noise (a measure of the carrier-to-noise ratio estimate) by performing the following: producing phase noise values as a function of carrier, symbol, or both; weighting the copies according to the phase noise values (so that copies with less phase noise are weighted more heavily than the copies with more phase noise); and summing the weighted values. The weightings may be adjusted (downward) if amplitudes of the copies exceed a minimum jammer threshold. These and other applicable techniques are described in some detail in the above-referenced U.S. application Ser. No. 09/377,131.

Still referring to FIG. 12, the process 186 reverses the frequency spreading performed by the frequency interleaving process. The output of the de-interleaver 180 is a set of 100 soft coded values quantized to 8-bit integer values, with +64 and −64 representing the ideal values, that is, a binary 1 and a binary 0, respectively. The 100 soft values are received by the turbo product decoder 182, which performs a turbo (iterative) decoding process on each set of horizontal code words and each set of vertical code words of the product code block to produce the original 25 information bits.

Figure 13:
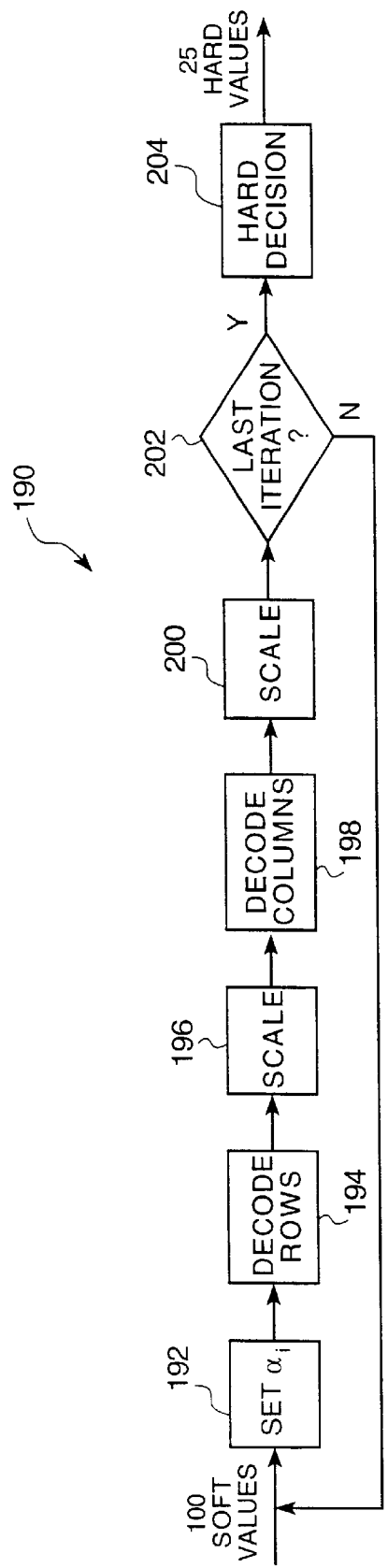
FIG. 13 is a flow diagram of a turbo product decoding process performed by the turbo product decoder of FIG. 10.

Referring to FIG. 13, a process of decoding the 100 element vector of soft values 190 as performed by the product code decoder 182 (of FIG. 12) is shown. The process 190 performs multiple decoding iterations on the (100, 25, 5) block organized in a 10×10 matrix based in the 100 element soft code vector. For each iteration i, the process 190 sets a weighting value $\alpha_i$ (step 192), decodes each of the rows (step 194), scales the output of the row decoding (step 196), decodes each of the columns (step 198) and scales the output of the column decoding (step 200). Thus, each iteration of the turbo product decoding process includes decoding each of 10 rows followed by decoding each of the 10 columns and, after row or column decoding, the values may be scaled as necessary to adjust the precision to the full precision of the memory. A scaling by a factor of 2 is applied to all elements of the 10×10 matrix when the maximum element has a value of less than half the maximum representable magnitude. For the case of 8 bit signed values, the scaling threshold is $2^{(7-1)}-1=63$. Values corresponding to noisy signals will require more scaling than those corresponding to strong signals.

Once the process 190 has completed the 10 row by 10 column decoding, it determines if the current iteration is the last iteration (step 202). If the current iteration is not the last iteration, then the process returns to step 192 for another pass. If the current iteration is determined to be the final iteration (at step 202), the process 190 performs a hard decision (having a threshold of zero) with respect to each of the 25 soft coded values corresponding to the original information bits to produce 25 hard values (step 204). The hard decision operates on each of the 25 values to produce one of two binary states for each bit to which such value corresponds. That is, the hard decision determines that each information bit having a corresponding soft value that is greater than zero is to be considered a binary 1 and each information bit having a corresponding soft value of less than zero is to be considered a binary 0.

Figure 14:
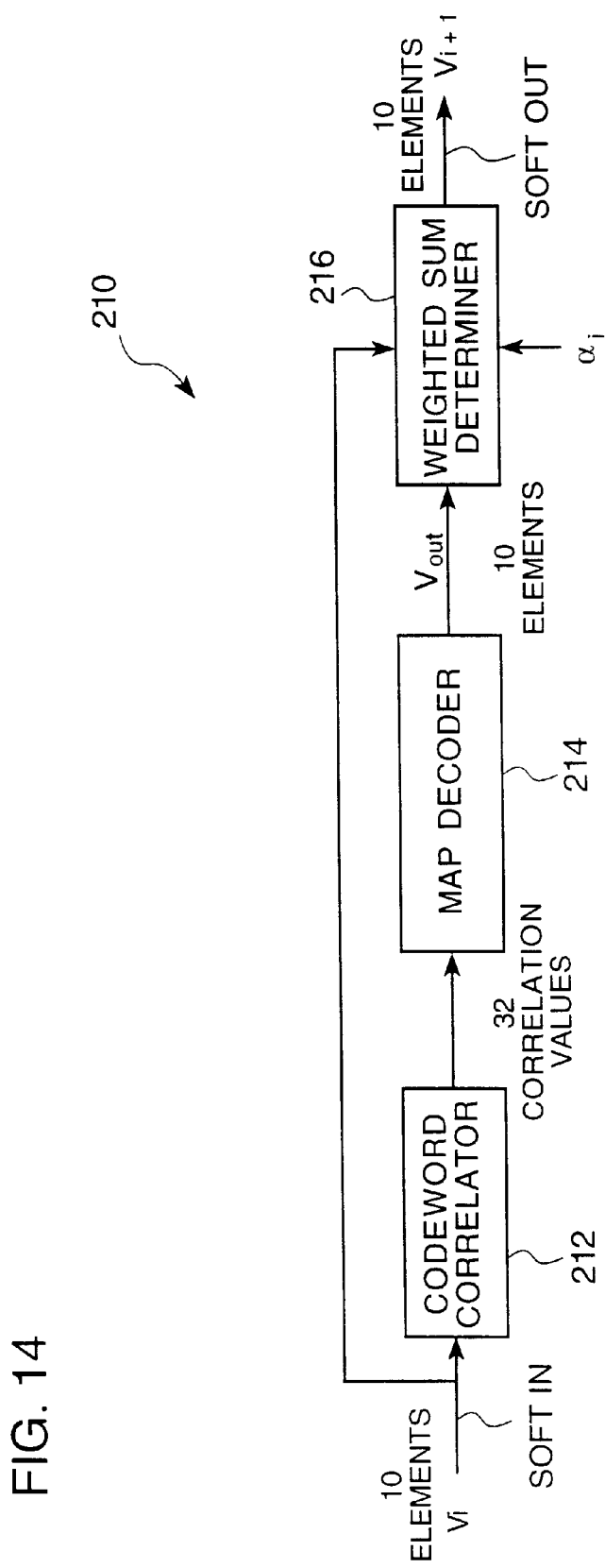
FIG. 14 is a block diagram of a row/column decoder for performing the row and column decoding operations of the turbo product decoder of FIG. 13, the row/column decoder including a code word correlator and a Maximum A Posteriori Probability (MAP) decoder.

Referring to FIG. 14, a conceptual depiction of a (10, 5, 4) soft-in soft-out block decoder 210 for performing the row/column decoding steps 194, 198 of the turbo product decoding process 190 (of FIG. 13) is shown. The soft-in soft-out block decoder 210 includes a codeword correlator 212, a Maximum A Posteriori Probability (MAP) decoder 214 and a weighted sum determiner 216. The codeword correlator 212 receives 10 row or column elements $V_i$ and operates on those 10 soft values to produce 32 correlation values, which are provided to the MAP decoder 214. The MAP decoder 214 produces from the 32 correlation values a new set of 10 soft values or elements $V_{out}$. The weighted sum determiner 216 receives $V_i$, $V_{out}$ and the current weighting factor $\alpha_i$, and updates the 10 soft values in each row or column (V) according to the weighted summation:

$$V_{i+1} = V_i + \alpha_i * (V_{out} - V_i) \qquad (1)$$

where $V_{out}$ is the soft value output (10 values) of the decoder at the current iteration i for the soft value input (10 values) of the row or column under consideration, $V_1$, and $V_{i+1}$ is the updated soft value output (10 row or column values) at the current iteration. Thus, during each iteration, the soft-in soft-out decoder 210 updates the current soft values $V_i$ with new values $V_{i+1}$, which corresponds to $V_i$ plus a $V_{out} - V_i$ difference value weighted to adjust the values $V_i$ by some amount towards the new values $V_{out}$. In the described embodiment, six iterations are performed using values of $\alpha_i=\{0.25, 0.5, 0.5, 0.75, 1, 1\}$. Because the soft values $V_{out}$ are more reliable after each iteration, the weightings are increased over the course of the iterative decoding process to produce a $V_{i+1}$ that is weighed more heavily in favor of $V_{out}$ than the previous pass. The number of iterations performed depends on overall system performance criteria, such a final bit rate, latency tolerance and available processing power.

A reduced complexity implementation of the code word correlator 212 and the MAP decoder 214 is shown in FIGS. 15–18 and FIG. 19, respectively. This implementation is based on the symmetry of the code word set and redundancy in the decoder operations. Computation of 32 correlation values, one for each codeword in the set of code words (from FIG. 6), performed by the correlator 212 is reduced to a set of permutations based on only eight sets of four correlation values and the MAP decoder 214 to a simple subtraction.

Figure 15:
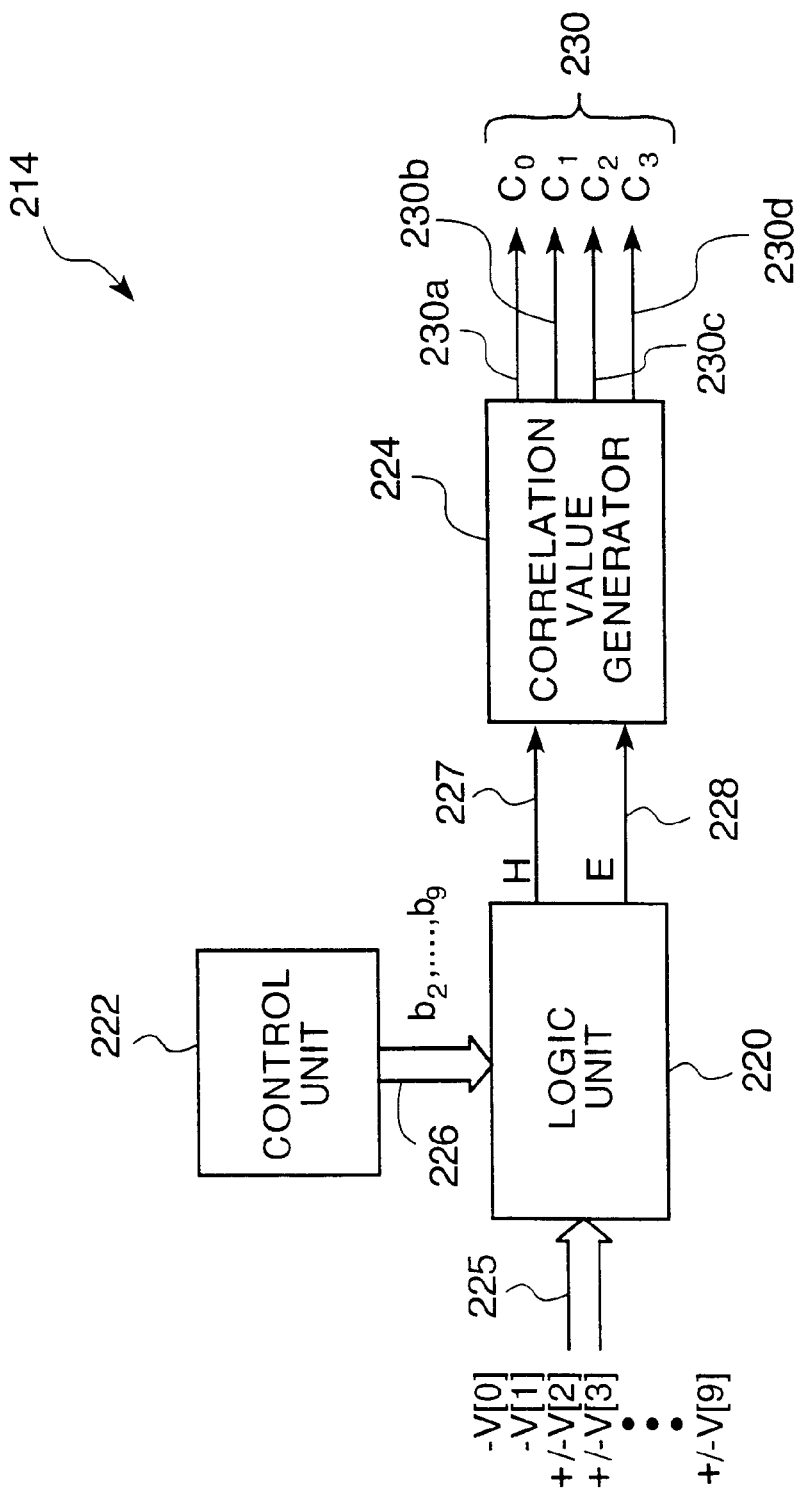
FIG. 15 is a block diagram of the code word correlator (shown in FIG. 14) including a logic unit, control unit and correlation value generator.

Referring to FIG. 15, the code word correlator 212 includes a logic unit 220, a control unit 222 and a correlation value generator 224. The logic unit 220 receives a row or column V of 10 soft values –V[0], –V[1], +/–V[2], . . . +/–V[9], 225 and operates on the soft values under the control of select bits $b_2, \ldots b_9$ 226 received from the control unit 222 to produce two correlation signals H and E, labeled with reference numerals 227 and 228, respectively. These signals are provided the correlation value generator 224, which generates as output a set of correlation values 230, including a first correlation value co 230a, a second correlation value $c_1$ 230b, and third correlation value $c_2$ 230c, and a fourth correlation value $c_3$ 230d.

Figure 16:
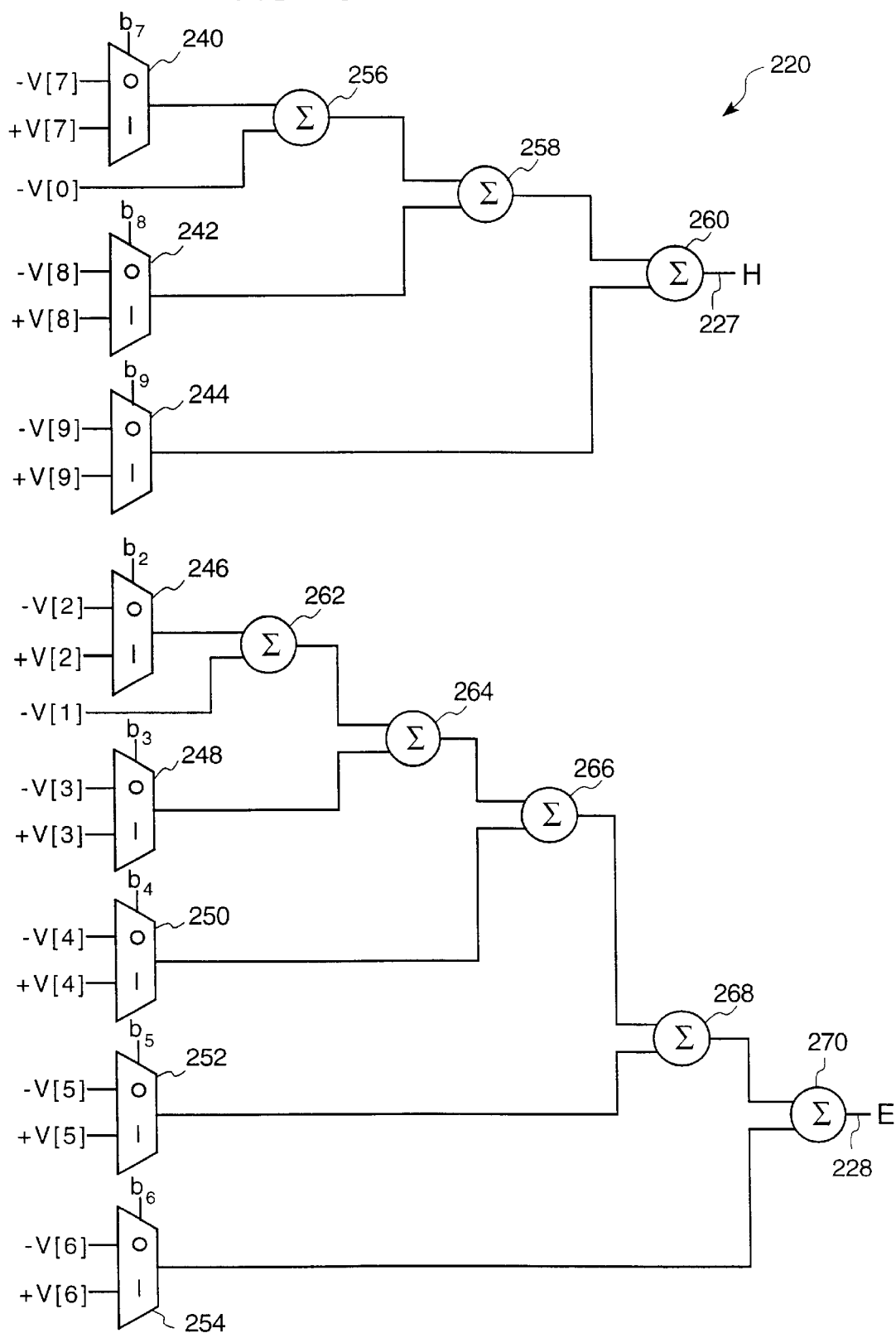
FIG. 16 is a circuit diagram of the code word correlator logic unit of FIG. 15.

Referring to FIG. 16, the logic unit 220 includes a plurality of MUX units 240, 242, 244, 246, 248, 250, 252 and 254, and a plurality of summation units 256, 258, 260, 262, 264, 266, 268, 270. The MUX unit 240 selects one of +V[7] and –V[7] according to a select $b_7$ (from the control unit 222). If $b_7$ is a 0, then the MUX provides as output –V[7]. If $b_7$ is a 1, then +V[7] is selected. The selected value is added by the summation unit 256 to –V[0]. The MUX unit 242 selects one of +V[8] and –V[8] according to a select $b_8$. If $b_8$ is a 0, then the MUX provides as output –V[8]. If $b_8$ is a 1, then +V[8] is selected. The selected value is added by the summation unit 258 to the output of the summation unit 256. The MUX unit 244 selects one of +V[9] and –V[9] according to a select $b_9$. If $b_9$ is a 0, then the MUX provides as output –V[9]. If $b_9$ is a 1, then +V[9] is selected. The selected value is added by the summation unit 260 to the output of the summation unit 258 to produce signal or value H 227.

The soft values for V[1] through V[6] are added or subtracted together in a manner similar to the soft values V[0], V[7], V[8], V[9]. The MUX unit 246 selects one of +V[2] and –V[21 ]according to a select $b_2$. If $b_2$ is a 0, then the MUX provides as output –V[2]. If $b_2$ is a 1, then +V[2] is selected. The selected value is added by the summation unit 262 to –V[1]. The MUX unit 248 selects one of +V[3] and –V[3] according to a select $b_3$. If $b_3$ is a 0, then the MUX unit 248 provides as output –V[3]. If $b_3$ is a 1, then +V[3] is selected. The selected value is added by the summation unit 264 to the output of the summation unit 262. The MUX unit 250 selects one of +V[4] and –V[4] according to a select $b_4$. If $b_4$ is a 0, then the MUX unit 250 provides –V[4] as its output. If $b_4$ is a 1, then +V[4] is selected as its output. The selected value is added by the summation unit 266 to the output of the summation unit 264. The MUX unit 252 selects one of +V[5 ] and –V[5 ] according to a select b5 . If b5 is a 0, then the MUX unit 252 provides –V[5 ] as its output. If $b_5$ is a 1, then +V[5 ] is selected as its output. The selected value is added by the summation unit 268 to the output of the summation unit 266. The MUX unit 254 selects one of +V[6] and –V[6] according to a select $b_6$. If $b_6$ is a 0, then the MUX unit 254 provides –V[6] as its output. If $b_6$ is a 1, then +V[6] is selected as its output. The selected value is added by the summation unit 270 to the output of the summation unit 268 to produce the signal E 228. It will be appreciated that the logic of logic unit 20 may be implemented in other ways, for example, using parallel adds.

Figure 17:
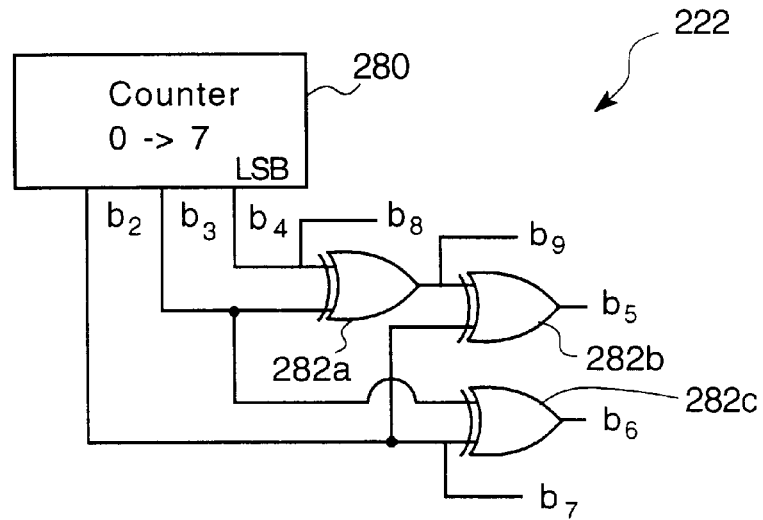
FIG. 17 is a circuit diagram of the code word correlator control unit of FIG. 15.

Referring to FIG. 17, the control unit 222 includes a 3-bit counter 280 coupled to XOR logic gates 282a, 282b, 282c generates the selects b2, . . . , b9 for the eight MUX units 240, 242, 244, 246, 248, 250, 252 and 254 (shown in FIG. 16), respectively. The bits $b_0$ and $b_1$ need not be generated by the control unit 222 as they do not change values for the eight states (corresponding to the first eight code words in the codeword table of FIG. 6). The bits $b_2$ through $b_9$ thus control the generation of each of the eight correlation values for each input 10 -element row/column (V).

Figure 18:
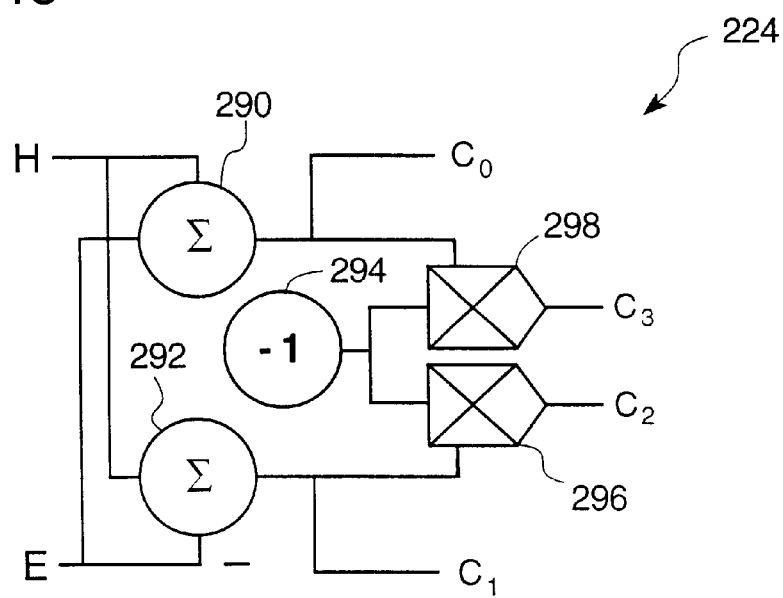
FIG. 18 is a circuit diagram of the correlation value generator of FIG. 15.

Referring to FIG. 18, the correlation value generator 224 receives signals H and E and adds these signals together via a first summation unit 290 to produce the first correlation value $c_o$, or subtracts E from H via a second summation unit 292 to produce the second correlation value $c_1$. The second correlation value $c_1$ is multiplied by a constant –1 294 via a first multiplier 296 (i.e., inverted) to produce the third correlation value $c_2$. The first correlation value $c_o$ is multiplied by the constant –1 294 via a second multiplier 298 to produce a fourth correlation value $C_3$ equal to an inverted $c_0$. The first correlation value $c_o$ corresponds to one of the eight code words in the first region 118a of the codeword set 112 (shown in FIG. 6). The second correlation value $c_1$ corresponds to one of the eight code words in the second region 118b (FIG. 6). The correlation values $c_2$ and $c_3$ correspond to code words in the third and fourth regions 118c and 118d, respectively (also shown in FIG. 6). Thus, the correlator 212 is able to produce 4 correlation values at the same time for each of eight states (i.e., eight code words) for a total of 32 correlation values, one for each of the code words in the codeword set 112. The correlation values are a measure of how close the 10 soft values (for a particular row or column) are to each of the 32 code words. The larger the correlation value, the closer the codeword is to the 10 soft values. Thus, once all 32 correlation values have been computed for the 10 soft values of a given row or column, the MAP decoder 214 is applied to each of the 10 values in the row or column under consideration to produce $V_{out}$.

Figure 19:
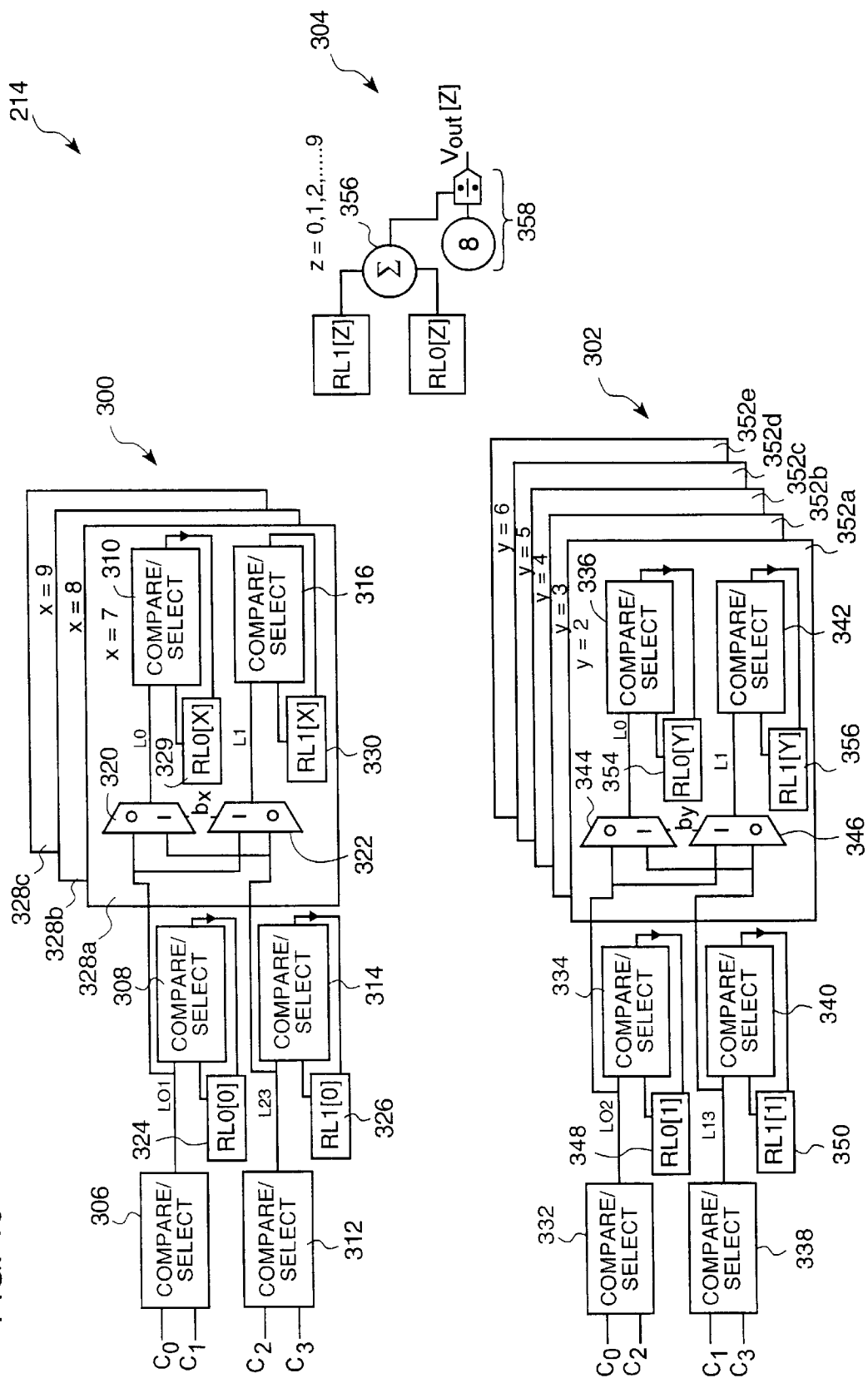
FIG. 19 is a circuit diagram of the MAP decoder shown in FIG. 14.

Referring to FIG. 19, the MAP decoder 214 includes a first logic unit 300, a second logic unit 302 and a third logic unit 304. The first logic unit 300 includes compare/select units 306, 308, 310, 312, 314 and 316, and MUX units 320 and 322. Each compare/select unit implements a "select largest" function by performing a signed comparison.

Referring to FIGS. 6 and FIG. 19, the top sixteen code words (regions 118a and 118b) of the codeword set 112 all have zero in bit position 0 ($b_0$). Similarly, the bottom sixteen code words (regions 118c and 118d) all have a one in bit position 0. Thus, the MAP decoder 214 compares correlation value $c_o$ to correlation value $c_1$ and selects the largest of the correlation values for a zero in bit position zero at compare/select 306 as L01. The compare/select 308 receives L01 as one input. The output of the compare/select 308 is connected to a register RL0[0] 324, the contents of which are provided as a second input to the compare/select unit 308. The results of the compare/select unit 308 are saved in the register RL0[0] 324. The MAP decoder compares correlation value $c_2$ with $C_3$ and selects the largest value of the correlation values for a one value in the bit position zero as L23. The compare/select 314 receives L23 as one input. The output of the compare/select 314 is connected to a register RL1[0] 326, the contents of which are provided as a second input to the compare/select unit 314.

Thus, for each decoding cycle (each of the eight states), the compare/select unit 308 selects the larger of L01 (the current selected largest zero value) and the last value stored in RL0[0] and the compare/select unit 314 selects the larger of L23 (the current selected largest one value) and the last value stored in RL1[].

The logic unit 300 further includes units 328a, 328b and 328c, each including the MUX units 320 and 322, the compare/select units 310 and 316, as well as registers RL0[X] 329 and RL1[X] 330. For unit 328a, X is 7. That is, for unit 328a, the register 329 is RL0[7] and the register 330 is RL1[7]. For units 328b and 328c, X is 8 and 9, respectively.

Under the control of control logic not shown, the outputs L01 and L23 are provided to the compare/select units 308 and 314, respectively, for bit zero (as discussed above), and are connected to a corresponding one of units 328a, 328b and 328c for bits 7, 8 and 9. Unlike bit 0, bits 7, 8 and 9 change during the state changes. This can be seen by referring back to the codeword table of FIG. 6, code words 0 through 7, bit positions 7, 8 and 9. Because the values of bits 7, 8 and 9 may be a one or a zero, the operation of the MUX units 320 and 322 are controlled by the value (0 or 1) of the control bit $b_x$ (generated by the control unit 222, of FIG. 17). Thus, if a bit position X has a zero value, the MUX unit 320 selects L01 in order to select the largest zero and MUX unit 322, which is used to select the largest one, will select L23, as the values for 7, 8 and 9 are the same for regions 0 and 1 and are the opposite of regions 2 and 3. Conversely, if the bit position X has a one value, then MUX 320 selects L23 instead of L01 and MUX 322 selects L01 instead of L23.

The results of the compare/select unit 310 are saved in the register RL0[X] 326, where X=7, 8, 9. The results of the compare/select unit 312 are saved in the register RL1[0] 328. The results of the compare/select unit 316 are saved in the register RL1[X] 330, where X=7, 8, 9.

The second logic unit 302 includes compare/select units 332, 334, 336, 338, 340 and 342, as well as MUX units 344 and 346. The compare/select unit 332 compares correlation value $c_0$ to correlation value $c_2$ and selects the larger of the two correlation values for a zero as an output value L02. The compare/select unit 338 compares correlation value $c_1$ with $C_3$ and selects the larger of the two as output value L13 for a one.

Still referring to FIGS. 6 and FIG. 19, code words in regions 118a and 118c of the code word set 112 all have zero in bit position 1 ($b_1$). Similarly, the code words in regions 118b and 118d all have a one in bit position 1. Thus, the MAP decoder 214 selects the largest correlation value corresponding to a bit position one equal to a zero at compare/select 332 as L02. The compare/select 334 receives L02 as one input. The output of the compare/select 334 is connected to a register RL0[0] 348, the contents of which are provided as a second input to the compare/select unit 334. The results of the compare/select unit 334 are saved in the register RL0[1] 348. The MAP decoder selects the largest correlation value for the bit position one equal to a one value at compare/select 338 as L13. The compare/select 340 receives L13 as a first input. The output of the compare/select 340 is connected to a register RL1[0] 350, the contents of which are provided as a second input a to the compare/select unit 340. The results of the compare/select unit 340 are saved in the register RL1[1] 350.

Thus, during each of the decoding cycles, the compare/select unit 334 selects the larger of L02 (the current selected largest correlation value for a zero) and the last value stored in RL0[1] and the compare/select unit 340 selects the larger of L13 (the current selected largest correlation value for a one value) and the last value stored in RL1[1].

The logic unit 302 further includes units 352a, 352b, 352c, 252d, 352d and 352e, each of which includes the MUX units 344 and 346, the compare/select units 336 and 342, as well as registers RL0[Y] 354 and RL1[Y] 356. For unit 352a, Y is 2, so the register 354 is RL0[2] and the register 356 is RL1[2]. For units 352b, . . . , 352e, Y is 2, . . . , 6, respectively.

The outputs L02 and L13 are provided to the compare/select units 334 and 340, respectively, for bit one, and are connected to a corresponding one of units 352a–352e for bits 2 through 9. Unlike bit 1, bits 2, 3, 4, 5 and 6 change values. This can be seen by referring back to the codeword table of FIG. 6, code words 0 through 7, bit positions 2 through 6. Because the values of bits 2 through 6 may be a one or a zero, the operation of the MUX units 344 and 346 are controlled by the value (0 or 1) of the control bits by (generated by the control unit 222, of FIG. 17). Thus, if a bit position Y has a zero value, the MUX unit 344 selects L02 in order to select the largest correlation value for a zero and MUX unit 346, which is used to select the largest correlation value for a one, will select L13, as the values for 2 through 6 are the same for regions 0 and 2 and are the opposite of regions 1 and 3. If the bit position Y has a one value, then MUX 344 selects L13 instead of L02 and MUX 346 selects L03 instead of L13. The results of the compare/select unit 336 are saved in the register RL0[Y] 354, where Y=2 through 6. The results of the compare/select unit 342 are saved in the register RL1[Y] 356, where Y=2 through 6.

Thus, for each bit zero through 9, the MAP decoder 214 examines, one state at a time, all sixteen of the correlation values that correspond to a codeword with a zero in the bit position and finds the largest value. With the registers RL0[0 . . . 9] initialized to 0 at the start of each row/column decode operation, the MAP decoder 214 saves the largest value in the appropriate register, RL0[0] 324 for bit 0, RL0[1] 348 for bit 1, RL0[Y] 354 for bits 2–6 and RL0[X] 329 for bits 7 through 9. The decoder 214 also examines all sixteen of the correlation values that correspond to a codeword with a one in the bit position and finds the largest value. With the registers RL1[0 . . . 9] initialized to 0 at the start of each row/column decode operation, the MAP decoder 214 save the largest value in the appropriate register, RL1[0] 326 for bit 0, register RL1[1] 350 for bit 1, RL1[Y] 356 for bits 2–6 and RL1[X] for bits 7–9.

The MAP decoder 214 employs the third logic unit 304 to subtract the final value in the register RL0[Z] (i.e., the largest zero) from the final value in RL1[Z] (i.e., the largest one), where Z is 0 to 9, via a summation unit 356, and divides the difference value by 8 with a divide-by-eight function 358 to produce the new soft value $V_{out}[Z]$. Thus, the MAP decoder 214 performs the process for each of the bit positions, and for each of the eight states (and thus 16 correlation values), to produce $V_{out}[Z]$, where Z=0 to 9.

OTHER EMBODIMENTS

It is to be understood that while the invention has been described in conjunction with the detailed description thereof, the foregoing description is intended to illustrate and not limit the scope of the invention, which is defined by the scope of the appended claims. Other embodiments are within the scope of the following claims.

What is claimed is:

1. A method of encoding frame data for an OFDM frame transmission, comprising:

producing a code block of elements from frame data to be modulated onto carriers of OFDM symbols in an OFDM frame; and interleaving elements of the code block so that the elements are modulated onto the carriers of the OFDM symbols in groupings along diagonals were the elements to be organized as a matrix.

2. The method of claim 1, wherein the frame data comprises PHY layer frame control information to support a medium access control protocol.

3. The method of claim 2, wherein the OFDM frame includes at least one delimiter and the PHY layer frame control information is located in the at least one delimiter.

4. The method of claim 3, wherein the OFDM frame includes a body and the at least one delimiter comprises a start delimiter that precedes the body.

5. The method of claim 3, wherein the at least one delimiter further comprises an end delimiter that follows the body.

6. The method of claim 3, wherein the at least one delimiter comprises a response.

7. The method of claim 3, wherein the at least one delimiter is of a Request-to-Send type.

8. The method of claim 3, wherein the medium access control protocol is of a Carrier Sense Multiple Access type.

9. The method of claim 3, wherein the medium access control protocol is a Time Division Multiple Access protocol and the at least one delimiter includes beacon information used by the Time Division Multiple Access protocol.

10. The method of claim 3, wherein the medium access control protocol is of a token passing type.

11. The method of claim 1, wherein the code block comprises a product code block.

12. The method of claim 1, wherein interleaving comprises:

selecting from the elements along the diagonals to produce diagonal sequences.

13. The method of claim 12, wherein the sequences collectively form a vector of vector elements.

14. The method of claim 13, wherein interleaving further comprises:

selecting consecutive vector elements from the vector for modulation on carriers in a succession of symbols so that the elements along the diagonals appear on adjacent carriers and across adjacent symbols in the succession of symbols to produce the groupings along diagonals.

15. The method of claim 13, wherein the number of OFDM symbols is three, and wherein selecting comprises:

selecting a first element in a main one of the diagonals and then every third element from among consecutive elements in the diagonals; and placing the selected first element and every third element in the vector in the order of selection.

16. The method of claim 15, wherein interleaving further comprises:

selecting consecutive vector elements from the vector for modulation on carriers in a succession of symbols so that the consecutive elements along the diagonals appear on adjacent carriers across adjacent symbols in the succession of symbols.

17. The method of claim 16, wherein selecting the consecutive vector elements from the vector for modulation on carriers in the successive symbols results in a level of redundancy.

18. The method of claim 13, wherein the number of OFDM symbols is four and the vector is arranged as an array of four columns of rows, and wherein selecting comprises:

selecting consecutive elements along each of the diagonals; and placing the selected consecutive elements in the vector in groups of adjacent ones of the rows.

19. The method of claim 14, wherein selecting the vector elements from the vector for modulation on carriers in the successive symbols results in a level of redundancy.

20. The method of claim 1, wherein the code block is a product code block and wherein producing comprises:

deriving the product code block from a shortened extended hamming code codeword set.

21. The method of claim 1, wherein producing further comprises:

selecting a generator matrix to achieve symmetric properties of the codeword set.

22. The method of claim 1, wherein the OFDM frame includes a body and the frame data comprises frame control information that precedes the body.

23. The method of claim 1, wherein the OFDM frame is an acknowledgement frame and the frame data comprises frame control information carried in the acknowledgement packet.

24. An apparatus for encoding data for an OFDM frame transmission, comprising:

an encoder for producing a code block of elements from frame data to be modulated onto carriers of OFDM symbols in an OFDM packet; and an interleaver coupled to the encoder for interleaving the elements so that the elements are modulated onto each carrier in groupings along diagonals were the elements to be organized as a matrix.

25. The apparatus of claim 24, wherein the frame data comprises PHY layer frame control information to support a medium access control protocol.

26. A computer program residing on a computer-readable medium for encoding data for an OFDM transmission, the computer program comprising instructions to cause a computer to:

produce a product code block of elements from data to be modulated onto carriers of OFDM symbols in an OFDM packet; and interleave elements of the product code block so that the elements are modulated onto each carrier in groupings along diagonals were the elements organized as a matrix.

27. A method of processing encoded frame control information comprising:

producing soft decision values from frame control information encoded in code words having information bits, and modulated in an interleaved order onto carriers in OFDM symbols, the code words belonging to a set of code words having properties of symmetry;

de-interleaving the soft decision values to produce sets of soft decision values, each set associated with one of the code words; and performing on each set of soft decision values a decoding procedure according to the properties of symmetry to reduce the complexity of the decoding procedure.

28. The method of claim 27, wherein the decoding procedure is a turbo decoding procedure, and wherein performing the turbo decoding procedure includes performing each of i iterations, and wherein performing each of i iterations comprises:

determining a new set of soft decision values from the set of soft decision values;

determining difference values for a difference between the set of soft decision values and the new set of soft decision values;

weighting the difference values; and updating the set of soft decision values with the sum of the set of soft decision values and the weighted difference values.

29. The method of claim 28, wherein determining a new set of soft decision values comprises:

generating from the set of soft decision values correlation values corresponding to a subset of the set of code words; and generating from correlation values corresponding to the subset correlation values corresponding to a remainder of the set of code words based on the properties of symmetry of the codeword set.

30. The method of claim 28, wherein determining a new set of soft decision values further comprises:

using the properties of symmetry of the code word set to select a best correlation value for each of the soft decision values.

31. The method of claim 27, wherein performing further comprises:

producing a hard decision value from each set of soft decision values for each of the information bits in the one of the code words with which the set of soft decision values is associated.

32. The method of claim 27, wherein the code words are produced by a product code and the turbo decoding procedure is a turbo product decoding procedure.

33. The method of claim 27, wherein the code words are in the form of a product code block of elements and the interleaved order includes copies of at least some of the elements, further comprising:

combining the copies.

34. The method of claim 33, wherein combining comprises:

producing carrier-to-noise ratio estimate values for the copies;

weighting the copies according to the carrier-to-noise ratio estimate values; and summing the weighted copies.

35. An apparatus comprising:

a demodulator for producing soft decision values from delimiter information encoded in code words having information bits, and modulated in an interleaved order onto carriers in OFDM symbols, the code words belonging to a set of code words having properties of symmetry;

a de-interleaving coupled to the demodulator for de-interleaving the soft decision values to produce sets of soft decision values, each set associated with one of the code words; and a decoder coupled to and for receiving the sets of soft decision values from the de-interleaver and for performing on each set of soft decision values a decoding procedure according to the properties of symmetry to reduce the complexity of the decoding procedure.

36. The apparatus of claim 35, wherein the decoder is a turbo decoder and further comprises:

means for generating from the set of soft values correlation values corresponding to a subset of the plurality of code words; and means for generating from correlation values corresponding to the subset correlation values corresponding to the remainder of the plurality of code words based on the symmetry of the codeword set.

37. The apparatus of claim 36, wherein the turbo decoder further comprises:

means for using the properties of symmetry of the codeword set to select a best correlation value for each of the soft values.

38. The apparatus of claim 36, wherein the code words are produced by a product code and wherein the turbo decoder is a turbo product decoder.

* * * * *

UNITED STATES PATENT AND TRADEMARK OFFICE
CERTIFICATE OF CORRECTION

PATENT NO. : 6,289,000 B1
DATED : September 11, 2001
INVENTOR(S) : Lawrence W. Yonge III It is certified that error appears in the above-identified patent and that said Letters Patent is hereby corrected as shown below:

<u>Title page,</u>
Item [56], References Cited, U.S. PATENT DOCUMENTS, "5,812,599", "Van Kerchkhove" should be -- Van Kerckhove --.

<u>Column 1,</u>
Line 60, "than" should be -- that --.

<u>Column 3,</u>
Line 38, after "it", insert -- is --.
Line 56, "and a" should be -- and an --.

<u>Column 10,</u>
Line 60, "55" should be -- (V) --.

<u>Column 11,</u>
Line 25, after "if", delete "the".
Line 33, "10 4" should be -- 104 --.
Line 60, after "(step 151)", insert -- . --.

<u>Column 12,</u>
Line 36, "a" should be -- an --.
Line 58, "10[33] 10" should be -- 10x10 --.

<u>Column 13,</u>
Line 15, after "d=R=C=0," insert -- s --.
Line 27, "t, is equal to $t_i$" should be -- $t_s$ is equal to $t_1$ --.
Line 29, "t," should be -- $t_1$ --.
Line 33, "$VI_{75}$" should be -- $Vi_{75}$ --; and "$VI_{26}$" should be -- $Vi_{26}$ --.
Line 41, "Vi52" should be -- $Vi_{52}$ --.

<u>Column 14,</u>
Line 4, "Vigg" should be -- $Vi_{99}$ --.

<u>Column 16,</u>
Line 60, "$V_1$" should be -- $V_i$ --.

<u>Column 17,</u>
Line 28, "co" should be -- $c_o$ --.
Line 52, "-V[21 ]" should be -- V[2] --.

UNITED STATES PATENT AND TRADEMARK OFFICE
CERTIFICATE OF CORRECTION

PATENT NO. : 6,289,000 B1
DATED : September 11, 2001
INVENTOR(S) : Lawrence W. Yonge III It is certified that error appears in the above-identified patent and that said Letters Patent is hereby corrected as shown below:

Column 18,
Line 29, "$C_3$" should be -- $c_3$ --.
Line 54, "FIGS." should be -- FIG. --.
Line 67, "$C_3$" should be -- $c_3$ --.

Column 19,
Line 49, "$C_3$" should be -- $c_3$ --.
Line 51, "FIGS." should be -- FIG. --.

Column 20,
Line 10, "252d" should be -- 352d --.
Line 24, "by" should be -- $b_y$ --.

Column 24,
Line 16, "de-interleaving" should be -- de-interleaver --.

Signed and Sealed this

Thirtieth Day of April, 2002

Attest:

Attesting Officer

JAMES E. ROGAN
*Director of the United States Patent and Trademark Office*